United States Patent
Gardner et al.

(10) Patent No.: US 12,328,919 B2
(45) Date of Patent: Jun. 10, 2025

(54) 3D ISOLATION OF A SEGMENTATED 3D NANOSHEET CHANNEL REGION

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 493 days.

(21) Appl. No.: 17/892,890

(22) Filed: Aug. 22, 2022

(65) Prior Publication Data

US 2024/0063261 A1 Feb. 22, 2024

(51) Int. Cl.
| | | |
|---|---|---|
| H01L 21/306 | (2006.01) | |
| H01L 21/28 | (2025.01) | |
| H10D 30/00 | (2025.01) | |
| H10D 30/69 | (2025.01) | |
| H10D 62/00 | (2025.01) | |
| H10D 62/10 | (2025.01) | |
| H10D 64/01 | (2025.01) | |
| H10D 64/66 | (2025.01) | |

(52) U.S. Cl.
CPC ..... *H10D 62/121* (2025.01); *H01L 21/28088* (2013.01); *H01L 21/30604* (2013.01); *H10D 30/797* (2025.01); *H10D 62/115* (2025.01); *H10D 64/017* (2025.01); *H10D 64/667* (2025.01)

(58) Field of Classification Search
CPC ........ H01L 21/28088; H01L 21/30604; H10D 30/797; H10D 30/6735; H10D 30/6757; H10D 62/115; H10D 62/121; H10D 64/017; H10D 64/667
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2019/0181224 A1* | 6/2019 | Zhang | H10D 64/017 |
| 2019/0189769 A1* | 6/2019 | Basker | H10D 62/834 |
| 2021/0296315 A1* | 9/2021 | Lilak | H10D 84/0188 |
| 2021/0399014 A1* | 12/2021 | Wu | H10B 51/20 |
| 2021/0407999 A1* | 12/2021 | Huang | H10D 88/00 |
| 2022/0102520 A1* | 3/2022 | Shiliang | H10D 30/6757 |
| 2022/0302275 A1 | 9/2022 | Yu et al. | |

* cited by examiner

*Primary Examiner* — Omar F Mojaddedi
(74) *Attorney, Agent, or Firm* — Foley & Lardner LLP

(57) ABSTRACT

Semiconductor devices and corresponding methods of manufacturing the same are disclosed. For example, a plurality of first semiconductor channels vertically spaced from one another and a plurality of second semiconductor channels vertically spaced from one another can be provided. The plurality of first semiconductor channels each have a first sidewall in contact with a first dielectric structure and the plurality of second semiconductor channels each have a first sidewall in contact with a second dielectric structure. A cavity can be formed between the first sidewalls of the plurality of first and second semiconductor channels. Gate structures can be formed around at least a top surface, a bottom surface, and a second sidewall of the first and second semiconductor channels.

20 Claims, 25 Drawing Sheets

3D ISOLATION OF A SEGMENTATED 3D NANOSHEET CHANNEL REGION

FIELD OF THE DISCLOSURE

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors or channels thereof are stacked on top of each other. 3D integration, i.e., the vertical stacking of multiple devices such as transistors or channels, aims to overcome scaling limitations experienced in planar devices by increasing transistor density in volume rather than area. Although device stacking has been successfully demonstrated and implemented, various embodiments can include numerous operations, and may include minimum feature distances which limit device density and performance.

SUMMARY

The present disclosure relates to non-planar, or 3D, structures and transistors. The channel regions of the transistors may be oriented to conduct current through the channel in a direction generally parallel with the major surface of the system or chip upon which, or within which, these structures are provided. Multi-channel designs may be utilized to provide cost, performance, and/or design advantages. The techniques and structures described herein provide a higher density of devices using vertically stacked transistors or channels thereof, which allows for a higher 3D density. Further, the vertical self-alignment of transistors pairs can increase density and minimum spacing between one or more vertically stacked transistors of the pair.

One aspect of the present disclosure can be directed to a method. The method can include providing a plurality of first semiconductor channels and a plurality of second semiconductor channels. The first semiconductor channels and the second semiconductor channels can be vertically spaced from one another. The plurality of first semiconductor channels can each have a first sidewall in contact with a first dielectric structure. The plurality of second semiconductor channels can each have a first sidewall in contact with a second dielectric structure. A second sidewall of each of the first semiconductor channels and the second semiconductor channels are exposed to a cavity. The cavity can be formed interposed between the first and second dielectric structures. The method can include forming a first gate structure around at least a top surface, a bottom surface, and the second sidewall of each of the plurality of first semiconductor channels. The method can include forming a second gate structure. The second gate structure can be formed around at least a top surface, a bottom surface, and the second sidewall of each of the plurality of second semiconductor channels.

Forming the first gate structure or the second gate structure can include forming a gate dielectric over the first semiconductor channels and the second semiconductor channels. Forming the first gate structure or the second gate structure can include forming a gate electrode over the gate dielectric. The gate electrode can include a plurality of horizontal portions vertically bounding the first semiconductor channels and the second semiconductor channels. The gate electrode can include a vertical portion connecting the plurality of horizontal portions. Forming the first gate structure or the second gate structure can include horizontally etching at least the horizontal portions of the gate electrode. The gate electrodes can be horizontally etched by forming openings to access opposite sidewalls of the horizontal portions of the gate electrode. The gate electrodes can be horizontally etched by horizontally etching the opposite sidewalls. Horizontally etching the opposite sidewalls can define a plurality of first source regions disposed on an opposite side of the first semiconductor channels from a plurality of first drain regions. Horizontally etching the opposite sidewalls can define a plurality of second source regions disposed on an opposite side of the second semiconductor channels from a plurality of second drain regions.

The method can include doping the first source regions and first drain regions with an n-type dopant. The method can include connecting a metal electrode to the first source regions and the first drain regions.

The method can include doping opposite ends of the plurality of first semiconductor channels and the plurality of second semiconductor channels. The doping can activate source/drain regions. The method can include forming a doped semiconductor over the opposite ends of the source/drain regions, to electrically connect to.

A contiguous doped semiconductor can be formed over each opposite end of the plurality of first semiconductor channels which connects to each of the plurality of first semiconductor channels.

The first gate structure and the second gate structure can be electrically connected along a vertical boundary thereof.

The first source regions and the first drain regions can include an n-type semiconductor. The second source regions and the second drain regions can include a p-type semiconductor.

The first source regions and the first drain regions can be or include an n-type semiconductor. The second source regions and the second drain regions can be or include a p-type semiconductor.

The first semiconductor channels and the second semiconductor channels can each include at least three semiconductor channels.

A dielectric spacer can be formed between the first gate structure and the second gate structure to electrically isolate the respective gate structures along at least a vertical boundary therebetween.

Forming the first gate structure can include forming a high-k dielectric over at least the top surface, the bottom surface, and the second sidewall of each of the plurality of first semiconductor channels. Forming the first gate structure can include forming a first gate electrode over the high-k dielectric. Forming the second gate structure can include forming the high-k dielectric over at least the top surface, the bottom surface, and the second sidewall of each of the plurality of second semiconductor channels. Forming the second gate structure can include forming a second gate electrode over the high-k dielectric.

The semiconductor channels can include an intrinsic semiconductor.

The first gate structure can be formed prior to the second gate structure.

Another aspect of the present disclosure can be directed to a method. The method can include forming a stack over a substrate. The stack can include first semiconductor layers and second semiconductor layers alternatively stacked on top of each other. The method can include patterning the stack to remove end portions thereof. The method can include forming first and second dielectric structures extending along opposite sidewalls of the patterned stack. The method can include forming a cavity through the patterned stack, laterally between the first dielectric structure and the second dielectric structure. The method can include removing second semiconductor channels of the first and second portions. The method can include forming a first gate structure over the top, bottom, and a sidewall of the first semiconductor layers of the first portion. The method can include forming a second gate structure over the top, bottom, and a sidewall of the first semiconductor layers of the first portion.

Forming the first gate structure can include forming a gate dielectric over the first and second semiconductor channels. Forming the first gate structure can include forming a gate electrode over the gate dielectric. The gate dielectric can include horizontal portions vertically bounding the first and second semiconductor channels. The gate electrode can include a vertical portion connecting the plurality of horizontal portions, and horizontally etching the horizontal portions of the gate electrode. The horizontal portions of the gate electrode can be etched by forming openings to access opposite sidewalls of the horizontal portions of the gate electrode. The horizontal portions of the gate electrode can be etched by horizontally etching the opposite sidewalls to define source and drain regions.

The gate dielectric can be a high-k dielectric. The first semiconductor channels can be include intrinsic semiconductor materials.

The first gate structure and the second gate structure can be electrically connected along a vertical boundary.

Yet another aspect of the present disclosure can be directed to a structure. The structure can include a first dielectric structure vertically extending from a substrate. The structure can include one or more first semiconductor channels extending away from the first dielectric structure along a first lateral direction, with a first sidewall of each of the one or more first semiconductor channels in contact with the first dielectric structure. The structure can include a second dielectric structure vertically extending from the substrate. The structure can include one or more second semiconductor channels extending away from the second dielectric structure along a second, opposite lateral direction, with a first sidewall of each of the one or more second semiconductor channels in contact with the second dielectric structure. The structure can include a first gate structure disposed around a top surface, a bottom surface, and a second sidewall of each of the one or more first semiconductor channels. The structure can include a second gate structure disposed around a top surface, a bottom surface, and a second sidewall of each of the one or more second semiconductor channels. The structure can include a pair of first source/drain structures disposed on opposite sides of the first gate structure along a third lateral direction perpendicular to the first and second lateral direction. The structure can include a pair of second source/drain structures disposed on opposite sides of the second gate structure along the third lateral direction.

The first gate structure can include a first high-k dielectric and a first metal electrode. The second gate structure can include a second high-k dielectric, different from the first high-k dielectric. The second gate structure can include a second metal gate electrode. The first gate structure can be electrically isolated from the second gate structure along a vertical plane therebetween, by a dielectric spacer.

The first gate structure and the second gate structure can be electrically connected along a shared vertical boundary.

3D integration, e.g., the vertical stacking of multiple devices or channels thereof, aims to overcome scaling limitations experienced in planar devices by increasing transistor density in volume rather than area. Although device stacking has been successfully demonstrated and implemented, various embodiments can include numerous operations, and may include minimum feature distances which limit device density and performance. Improved systems and methods to design devices having improved density, performance, or manufacturability is being pursued.

Techniques herein include methods of forming vertical transistors or transistors having vertically stacked channels regions, source regions, or drain regions. Techniques herein enable a memory or logic device to be formed from vertically stacked nanosheets or other layers. The channels can be a three channel transistor wherein drive strength of the transistor can be increased or decreased according to forming additional or fewer channels (e.g., additional vertical or horizontal channels). A channel layer can be substituted for an isolation material, such as a dielectric to form a plurality of isolated transistors. In some embodiments, various portions of the transistors may not be isolated, which can reduce a number of operations (e.g., to create a single transistor with increased drive strength). The transistors can be formed having a defined width, wherein the gate electrode is formed, and subsequently etched back to a lesser width to permit the formation of a dielectric layer to isolate the source and drain regions from the gate electrode. The remaining source and drain regions can be connected to a metal electrode or they can be extended, such as by epitaxial growth (and may thereafter be connected to an electrode or other interconnect.)

In some embodiments, a semiconductor device can include a plurality of nanosheet layers to form a first semiconductor-based transistor and a second, vertically aligned semiconductor-based transistor. A number of semiconductor (e.g., silicon) layers can define a number of channels of the transistor. For example, a semiconductor device having three silicon layers can form a transistor having three channel regions for each transistor. In some embodiments, additional semiconductor-based transistors can be formed along a vertical structure of the semiconductor device or may be laterally offset therefrom. In some embodiments, additional semiconductor layers can define additional channel regions of the transistors, or additional transistors. For example, a semiconductor device having six silicon layers can form one transistor pair having six channel regions, six transistors having one channel region, two transistor pairs having one channel region, and a transistor pair having two regions, and so on. For example, transistors can include a complementary field effect transistor (CFET) pair. Various operations or components of the various embodiments can be substituted, omitted, added, or modified. For example, transistors types can be varied according to a desired application (e.g., p-type or n-type).

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
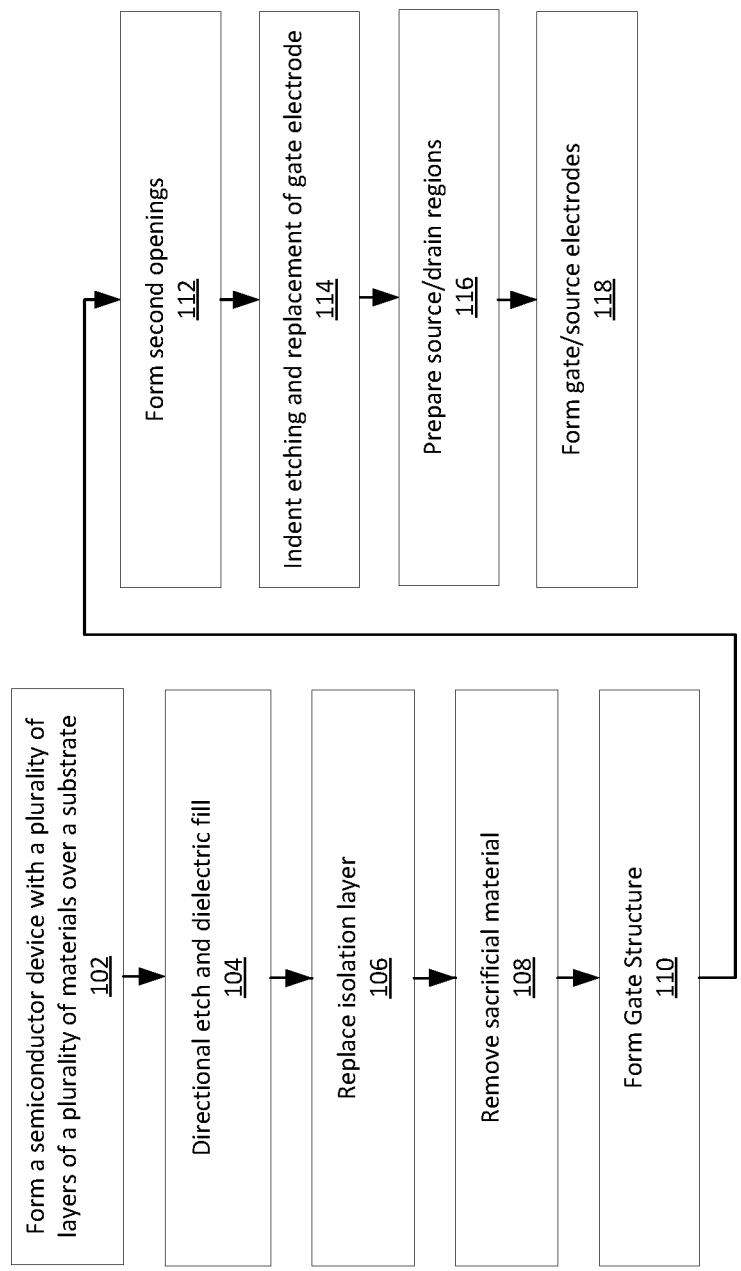
FIG. 1 is a flow chart of a method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more vertical transistor structures having one or more stacks formed from nanosheets. The stacks can include semiconductor channels such as silicon layers. In some embodiments, silicon germanium sacrificial layers are disposed between the semiconductor channels. Based on a scalable architecture of such semiconductor channels, advantageously, the vertical transistor structures, as disclosed herein, may be scaled in performance or quantity. In some aspects, any number of the vertical transistor structures can be laterally (e.g., side-by-side) arranged with each other and vertically stacked on top of one another, thereby forming an array of vertical transistor structures having improved characteristics in an area efficient manner. For example, the array can include pairs of transistors having a reduced spacing dimension therebetween compared to at least some other transistor to transistor spacing dimensions.

Reference will now be made to the figures, which for the convenience of visualizing the 3D fabrication techniques described herein, illustrate a substrate undergoing a process flow. Unless expressly indicated otherwise, each figure represents one (or a set) of fabrication steps in a process flow for manufacturing the devices described herein. In the Figures, connections between conductive layers or materials may be shown. However, it should be understood that these connections between various layers and masks are merely illustrative, and are intended to show a capability for providing such connections and should not be considered limiting to the scope of the claims.

Likewise, although the figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a rectangular configuration, other shapes are also contemplated, and indeed the techniques described herein may be implemented in any shape or geometry.

FIG. 1 illustrates a flow chart of a method 100 for making a transistor pair, based on a vertical stack structure. For example, the vertical stack structure can be formed by a plurality of nanosheets to form a semiconductor device. The vertical stack structure can include two transistors and an electrical connection therebetween. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with top views and cross-sectional views of an example semiconductor device (also referred to herein as a structure) at various fabrication stages as shown in FIGS. 2 to 12, which will be discussed in further detail below. It should be understood that the semiconductor device, shown in FIGS. 2 to 12, may include a number of other devices such as inductors, fuses, capacitors, coils, etc., while remaining within the scope of the present disclosure.

In brief overview, the method 100 starts with operation 102 of forming a semiconductor device comprising a plurality of materials formed over a substrate. The method 100 continues to operation 104 of directionally etching a portion of the semiconductor device, and filling the etched portion with a dielectric fill. The method 100 proceeds to operation 106 of isolating a portion of the semiconductor device from the substrate. The method 100 proceeds to operation 108 of removing a sacrificial material. The method 100 proceeds to operation 110 of forming a gate structure over the semiconductor layers. The method 100 proceeds to operation 112 of forming second openings. At operation 114, horizontal portions of the gate electrode are selectively horizontally etched (e.g., indent etched). At operation 116, the source/drain regions are prepared for connection such as by doping or a connection of metal electrodes. At operation 118, electrodes are formed to connect to the source/drain regions.

Figure 2:
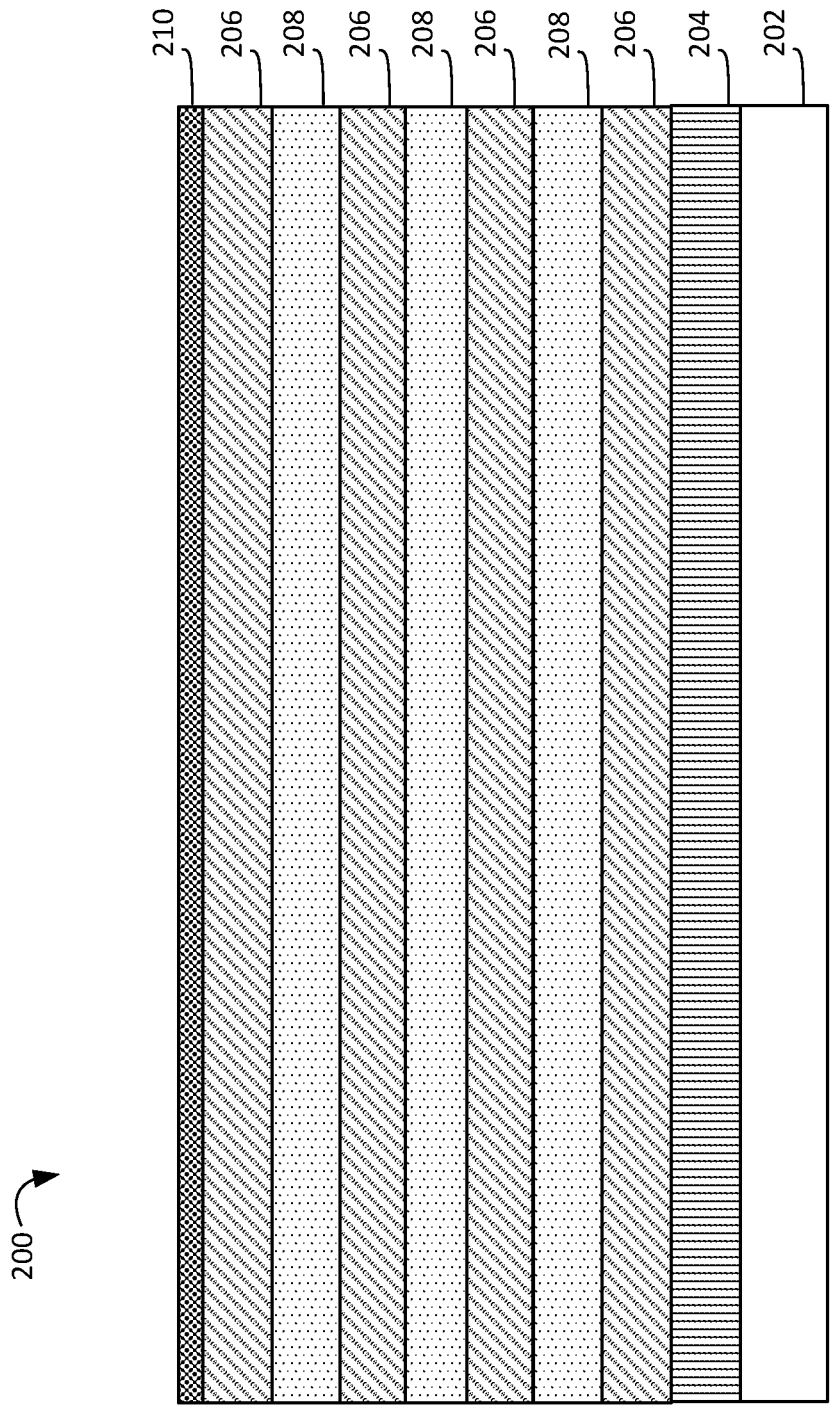
FIG. 2 illustrates a cross sectional view of a semiconductor device during various fabrication stages, made by the method of FIG. 1, in accordance with some embodiments.

Corresponding to operation 102 of FIG. 1, FIG. 2 is a cross sectional view of a semiconductor device 200 in which a plurality of layers (e.g., blanket layers), including a plurality of materials, are formed over a substrate 202 (e.g., a crystalline silicon, a glass substrate, etc.), in accordance with various embodiments.

As shown in FIG. 2, a substrate isolating layer 204 can be formed over the substrate 202. The substrate isolating layer 204 and the various additional dielectric and conductive layers and materials herein can be placed, grown, (e.g., epitaxially with or without a seed layer), or otherwise formed to create layers of the semiconductor device 200. The layers can also be referred to as films, channels, or according to their constituent materials. The formation of the various layers of the semiconductor device 200 can include planarization of the layers, such as by cutting, ablation, chemical mechanical grinding or polishing (CMG/P), or other planarization techniques. The substrate isolating layer 204 can be or include a material which can be selectively etched, relative to one or more adjacent materials, such as the substrate 202 and a sacrificial material layer 206. For example, the substrate isolating layer 204 can be formed from silicon-germanium of a first molar ratio, the substrate 202 can be formed from crystalline silicon, and the sacrificial material layer 206 can be formed from silicon-germanium of a second molar ratio. Thus, the substrate isolating layer 204 can be an epitaxially grown sacrificial nanosheet layer which can be selectively removed without removing one or more adjoining layers.

The sacrificial material layer 206 is formed over the substrate isolating layer 204. The sacrificial material layer 206 can include a different material than the substrate isolating layer 204. For example, the sacrificial material layer 206 can be an epitaxially grown SiGe layer, as discussed above. A semiconductor layer 208 can be formed over the sacrificial material layer 206. The semiconductor layer 208 can be or include a semiconductor material such as silicon (e.g., intrinsic silicon), which may be epitaxially grown over the sacrificial material layer 206. The semiconductor layer comprises a different material (e.g., an additional, fewer, or different ratio of a material) relative to the sacrificial material layer 206, even where the sacrificial material layer 206 comprises a semiconductor as in the example of SiGe. An additional sacrificial material layer 206 can be formed (e.g., epitaxially grown) over the semiconductor layer 208. The sacrificial material layer 206 can be or include a dielectric or semiconductor which can be selectively etched relative to the semiconductor material of the semiconductor layer 208. Another semiconductor layer 208 can be formed on the surface of the semiconductor device 200.

Any number of additional semiconductor layers 208 can be formed over the semiconductor device. For example, the additional semiconductor layers 208 can be disposed between alternating layers of sacrificial material layers 206. In some embodiments, additional isolating layers 204 can isolate portions of the semiconductor device (e.g., to isolate between vertically stacked transistors formed according to the systems and methods disclosed herein). The semiconductor layers 208 can be formed as a doped semiconductor (e.g., epitaxially grown with a dopant or dopant precursor), or formed and thereafter doped such as by diffusion or ion implantation. For example, at least one layer can be an n-type semiconductor or at least one layer can be a p-type semiconductor. As discussed above, in some embodiments the semiconductor layers 208 can be or include an intrinsic semiconductor such as intrinsic silicon. A cap layer 210 of the semiconductor device 200 can be formed (e.g., deposited) over the upper surface of the semiconductor device (e.g., as an uppermost blanket layer). The cap layer 210 can be a protectant from environmental or processing operations (e.g., the methods disclosed herein). For example, the cap layer 210 can be a hard mask. In some embodiments, additional or fewer sacrificial or semiconductor layers 208 may be formed. For example, although the transistors of the various embodiments disclosed herein are disclosed as tri-gate transistors (e.g., comprising three source/drain layers), transistors may be formed of additional or fewer source/drain layers (e.g., dual-gate transistors or quad-gate transistors). The tri-gate transistors are sometimes referred to as nano-fork or fork-sheet devices.

Figure 3:
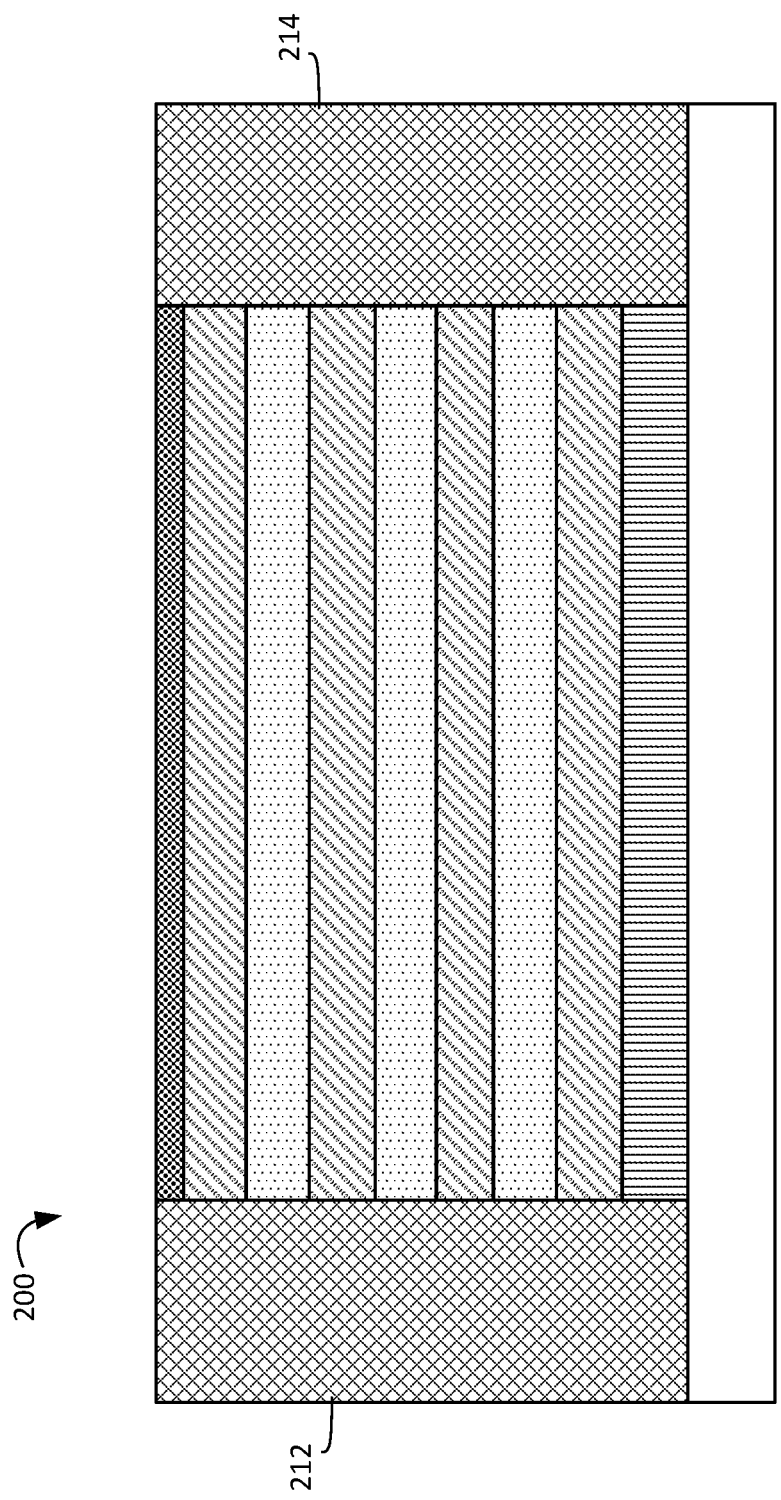
FIG. 3 illustrates a cross sectional view of a semiconductor device during various fabrication stages, made by the method of FIG. 1, in accordance with some embodiments.

Corresponding to operation 104 of FIG. 1, FIG. 3 is a cross sectional view of the semiconductor device 200 in which the layers of the respective nanosheets are patterned by directionally etching and replaced with a body dielectric to remove the end portions thereof, in accordance with various embodiments. The body dielectric can include a first dielectric structure 212 on a first side of the stack and a second dielectric structure 214 on a second side of the stack. A mask (not depicted) defines a first portion of the semiconductor device 200 for etching, and a second portion of the semiconductor device 200 to remain. The remaining portions of each nanosheet of the semiconductor device 200 can be referred to herein as stacks. To etch the first portion, a first patternable layer (e.g., a photoresist material) can be formed over the surface of the semiconductor device 200. The layers of the semiconductor device 200 can be etched to a depth of the substrate 202. For example, the etchant can be timed to etch to the substrate 202, the substrate 202 can be non-reactive with the etchant, or an etch stop layer can be disposed along a surface of the substrate 202. The etching process may be anisotropic and/or isotropic. The photoresist material can be stripped from the semiconductor device 200, and the body dielectric (also referred to herein as a dielectric structure) can be formed in an etched area. For example, the body dielectric can be formed by a deposition process (e.g., CVD), or another fill process and any dielectric disposed over the surface of the semiconductor device (e.g., over the cap layer 210) can be removed by a planarization process such as CMG/P. The etching can leave vertical structures (e.g., columns or transistor core stacks) of the plurality of stacks. For example, a plurality of vertical structures can be formed at regular interval to form a device wherein at least one transistor pair is formed from each of the depicted stacks. The first dielectric structure 212 and the second dielectric structure 214 can be connected, such as in a plane parallel to the depicted plane. For example, the body dielectric can contain an array of semiconductor devices 200, wherein a first dielectric structure, with regard to one semiconductor device 200 can be the second dielectric structure with regard to another semiconductor device 200.

Figure 4:
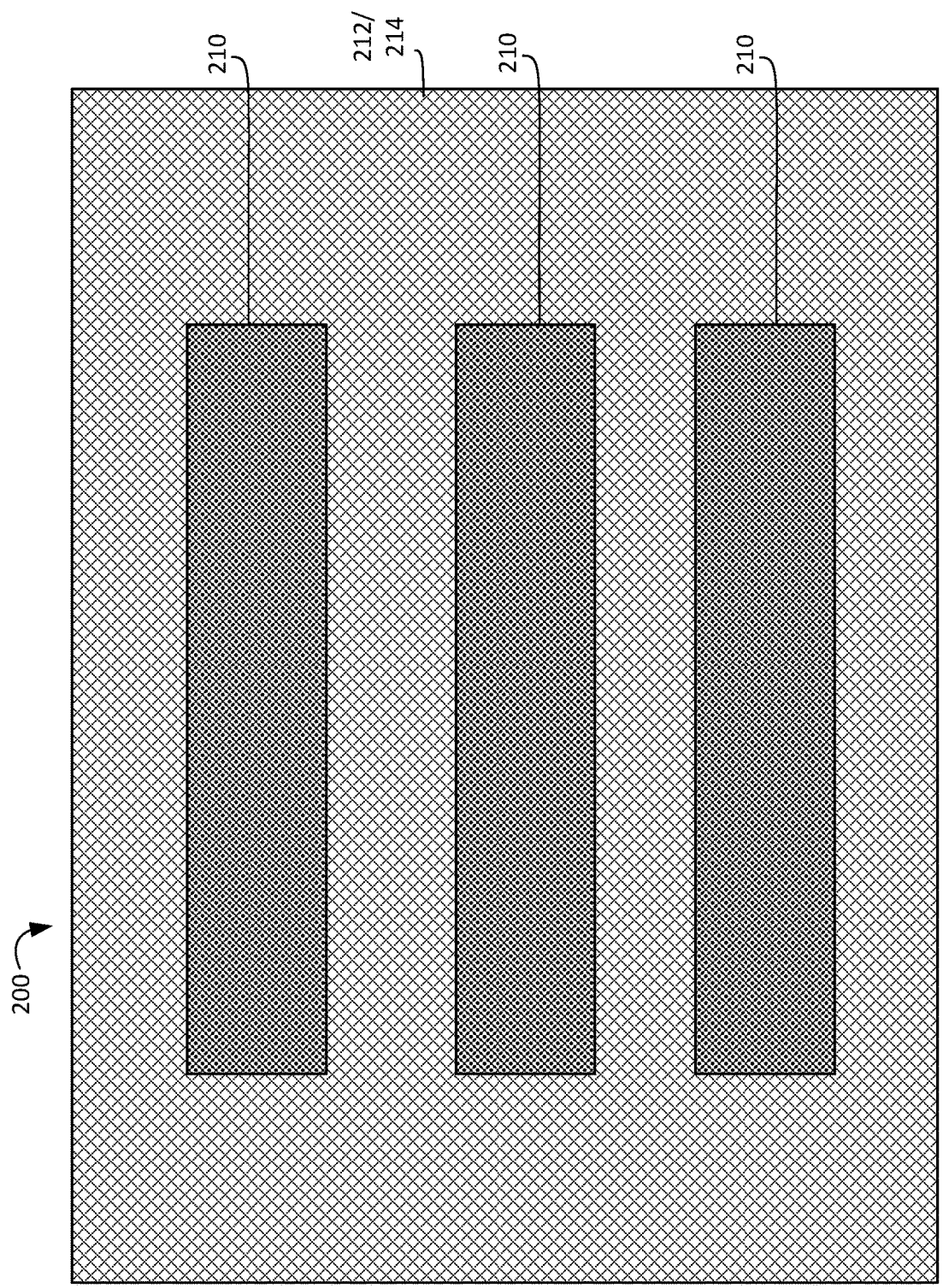
FIG. 4 illustrates a top view of a semiconductor device during various fabrication stages, made by the method of FIG. 1, in accordance with some embodiments.

With continued correspondence to operation 104, FIG. 4 depicts a top view of the semiconductor device 200 of FIG. 3. Depicted are three of the structures of FIG. 3, disposed laterally offset therefrom. In some embodiments, further structures can be disposed laterally from the depicted structures (e.g., along a second lateral dimension, perpendicular from the lateral direction of the depicted structures, or a combination thereof). Also depicted is the body dielectric which comprises the dielectric structures for each of the depicted devices.

Figure 5:
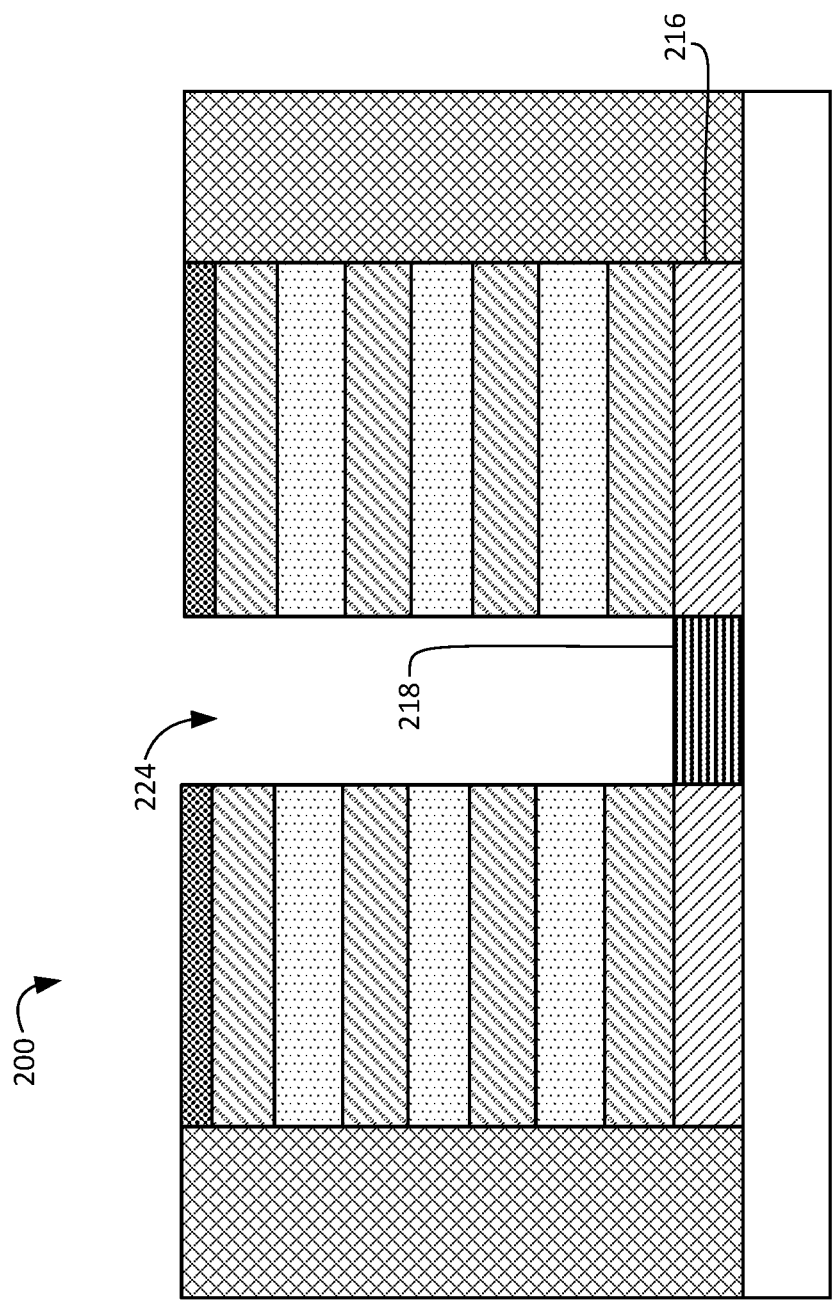
FIG. 5 illustrates a cross sectional view of a semiconductor device during various fabrication stages, made by the method of FIG. 1, in accordance with some embodiments.

Corresponding to operation 106 of FIG. 1, FIG. 5 is a cross sectional view of the semiconductor device 200 in which the substrate isolating layer 204 deposited over the surface of the substrate 202 is replaced, in accordance with various embodiments. A bottommost film (e.g., substrate isolating layer 204) of the structure is selectively removed. For example, a cavity 224 is formed in the structure to introduce an etchant. The bottommost film can be a dielectric or a silicon-germanium material of different mole fraction than the sacrificial films (deposited as sacrificial material layers 206) or other portions of the semiconductor device 200. An etchant (e.g., a wet etchant) can be introduced to the semiconductor device 200 via the cavity 224, and the etchant can thereby access and etch the bottommost film of the semiconductor device 200. The removal of the bottommost film can isolate additional layers of the semiconductor device 200 from the substrate 202. For example, the etchant can be stripped from the semiconductor device 200 to form an air gap between the substrate 202 and a sacrificial film of the semiconductor device 200. In some embodiments, an isolating dielectric material 216 can fill the air gap. A directional etching process (e.g., plasma etching process) can remove a portion of the dielectric of the substrate isolating layer 204 (e.g., to the substrate 202). A (different) center isolating dielectric 218 can form the center portion of the substrate isolating layer 204, such as a material which is resistive to etchants used during further operations of the cavity 224. The center isolating dielectric 218 can be formed according to a defined height, or can be formed to a surface of the structure and thereafter etched back.

Figure 6:
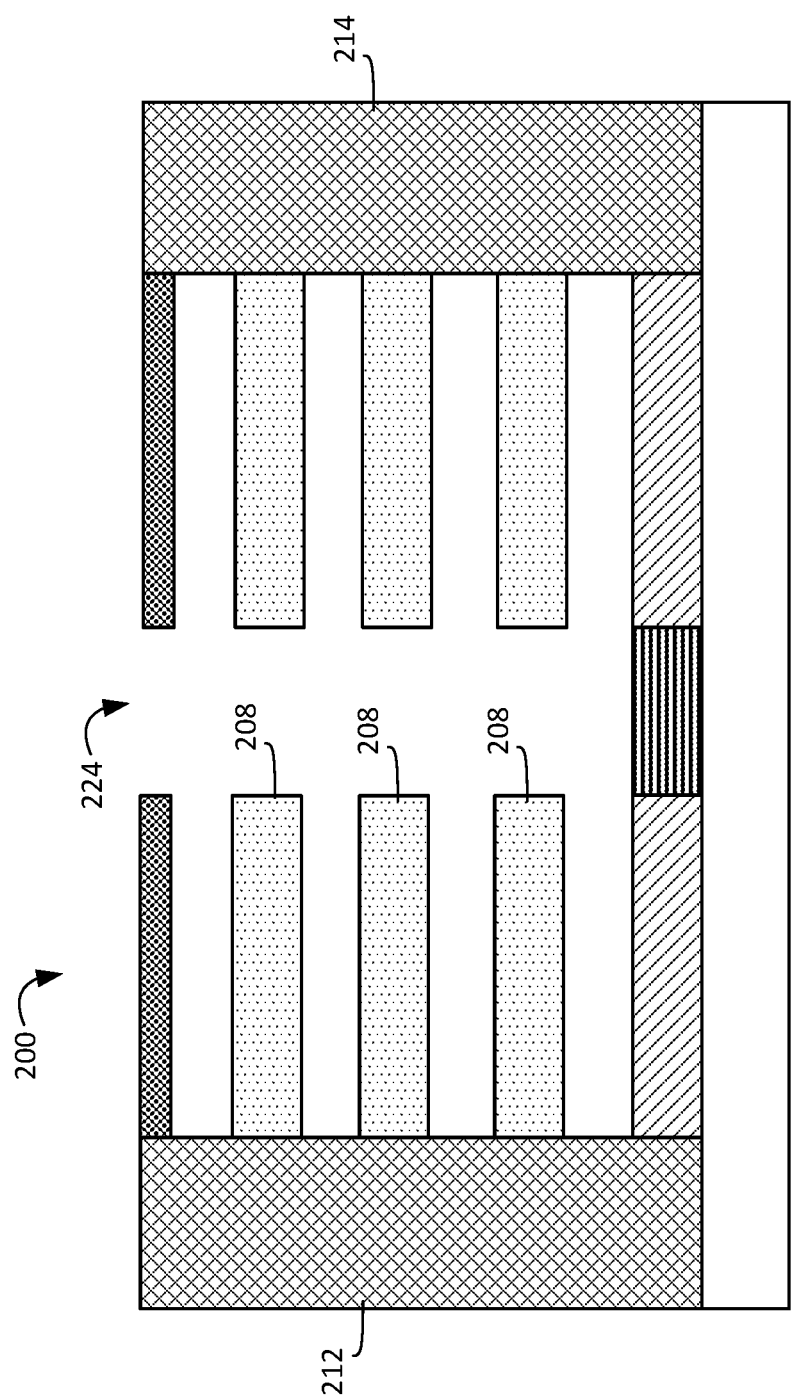
FIG. 6 illustrates a cross sectional view of a semiconductor device during various fabrication stages, made by the method of FIG. 1, in accordance with some embodiments.

Corresponding to operation 108 of FIG. 1, FIG. 6 is a cross sectional view of the semiconductor device 200 in which additional material deposited as sacrificial material layers 206 are removed from the semiconductor device 200, in accordance with various embodiments. As shown in FIG. 6, the sacrificial material can be etched and removed in similar fashion to the material of the isolating layer 204. For example, an etchant can be introduced through the cavity 224 to remove sacrificial material layers 206 material disposed vertically adjacent to the remaining semiconductor materials.

As depicted in FIG. 6, each remaining portion of the semiconductor layer 208 is vertically adjacent to removed sacrificial material layers 206. The etchant can selectively etch the material deposited in the sacrificial material layers 206, relative to the body dielectric 212, 214, and the remaining semiconductor layers 208. The selectivity can be based on the material properties of a bulk material or can be based on one or more intermediate layers (e.g., oxidation layers or etch stop layers) formed over the various layers and materials thereof.

Figure 7:
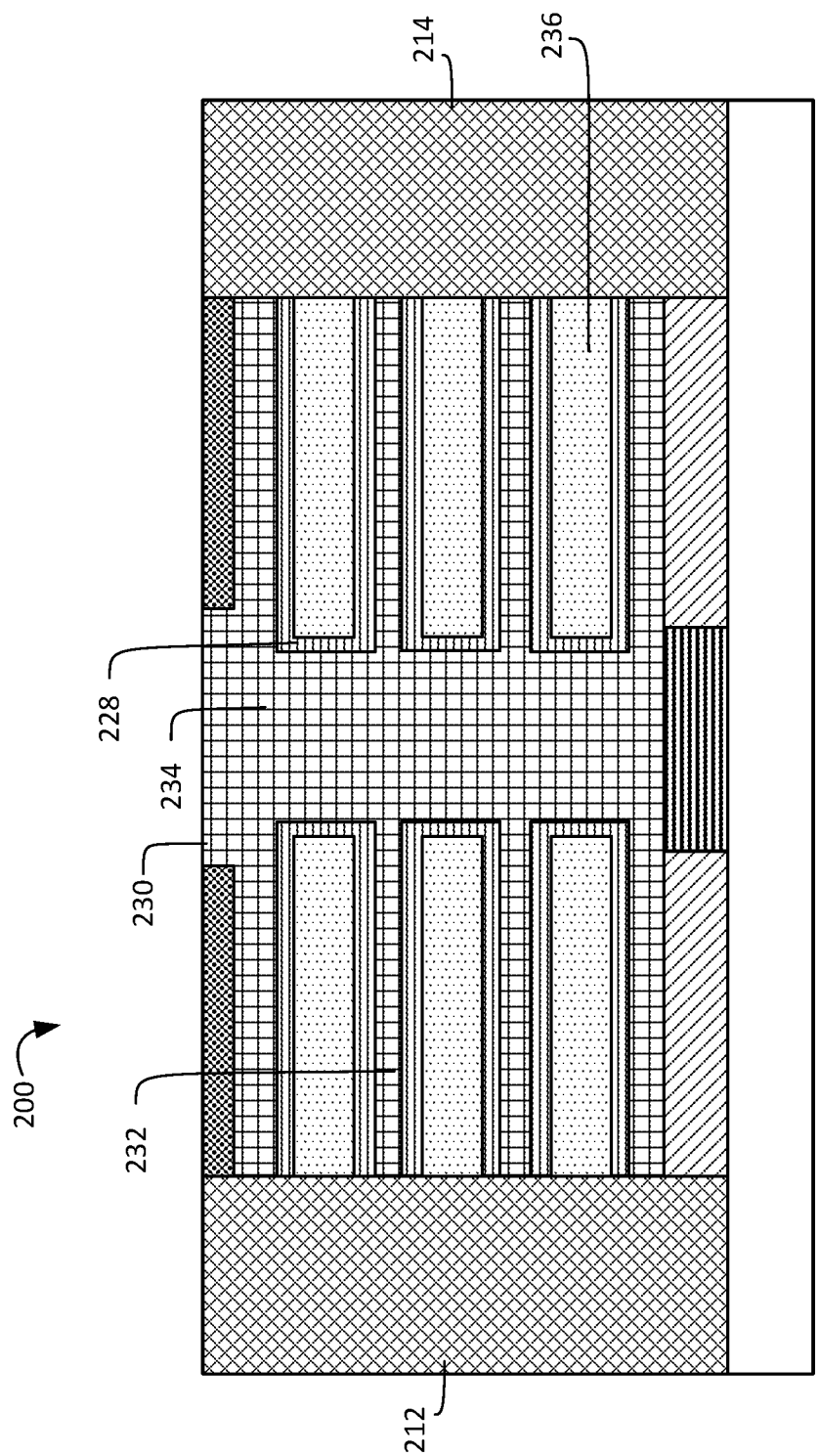
FIG. 7 illustrates a cross sectional view of a semiconductor device during various fabrication stages, made by the method of FIG. 1, in accordance with some embodiments.

Corresponding to operations 110 of FIG. 1, FIG. 7 is a cross sectional view of the semiconductor device 200 in which a gate structure is formed, in accordance with various embodiments. A gate dielectric 228 is formed at over at least a remaining portion of the semiconductor layers 208. The gate dielectric 228 can be a high-k dielectric. The gate dielectric 228 can be configured to selectively adhere to the semiconductor (e.g., silicon) of the semiconductor device 200. As shown, the gate dielectric 228 can cover a first portion of at least some portion of the semiconductor material of the semiconductor layers 208. A second portion of the semiconductor layers 208 may not be covered by the gate dielectric 228. For example, FIG. 7 depicts the outer faces of the semiconductor layers 208 as originally deposited, along a plane defined by the interface of the body dielectric. Each of the semiconductor layers 208 can be vertically bounded by the gate dielectric 228, and may interface with the body dielectric, such that the portions of the respective gate dielectric may not interface directly with the adjacent dielectric structure 212, 214 (e.g., the transistors described herein may not be gate-all-around transistors).

A gate electrode 230 is formed over the gate dielectric 228. The gate can be selectively formed over the gate dielectric 228, or can be formed by another process. For example, one or more metal materials (e.g., alloys, coatings, or elements) can be grown along the gate dielectric 228. In some embodiments, the gate electrode 230 is deposited to fill the cavity 224 and the upper surface of the semiconductor device 200 is thereafter planarized. The gate electrode 230 can be a metal gate electrode 230. For example, the gate electrode 230 can include cobalt, copper, aluminum, silver, gold, tungsten, the like, or alloys or other combinations (e.g., layers) thereof. The gate electrode 230 can fill the cavity 224 or any evacuated portion of the semiconductor device 200 connected thereto. For example, the gate electrode 230 can fill the recesses evacuated by the material of the sacrificial material layers 206, such that the gate electrode 230 can encapsulate the gate dielectric 228. The gate electrode can include a plurality of horizontal portions 232 and a central vertical portion 234 to connect the horizontal portions 232. As depicted in FIG. 7, at an interface between the stack and the body dielectric, the gate electrode 230 can extend to a same lateral dimension as the gate dielectric 228, such that the interface between the gate dielectric 228 and the body dielectric is maintained (e.g., the gate dielectric 228 and the body dielectric may directly interface).

With further reference to FIG. 7, the material of the semiconductor layers 208 can be defined according to a function thereof. The semiconductor layers 208 can be defined as channels or channel regions 236 of the semiconductor device 200. The channel regions 236 may also be referred to as semiconductor channels. In some embodiments, channel regions 236 separated by the cavity 224 can be channel regions 236 of a same single transistor. For example, the transistor can include one or more (e.g., three) vertically stacked channel regions 236. In some embodiments, the vertical portion 234 of the gate electrode 230 can have a dimension to allow for a lithographic process to form a separation therebetween (e.g., to form the dielectric spacer 240 of FIG. 8). For example, the vertical portion 234 of the gate electrode 230 can be at least 100 nm in width. In some embodiments, the dimension between the channel regions 236 can be less than a distance to support one or more lithographic techniques, and any etching/deposition processes to form the dielectric spacer 240. Such channel regions can be, for example, less than 100 nm in dimension between gate structures (e.g., in a range of 15-25 nm).

Figure 8:
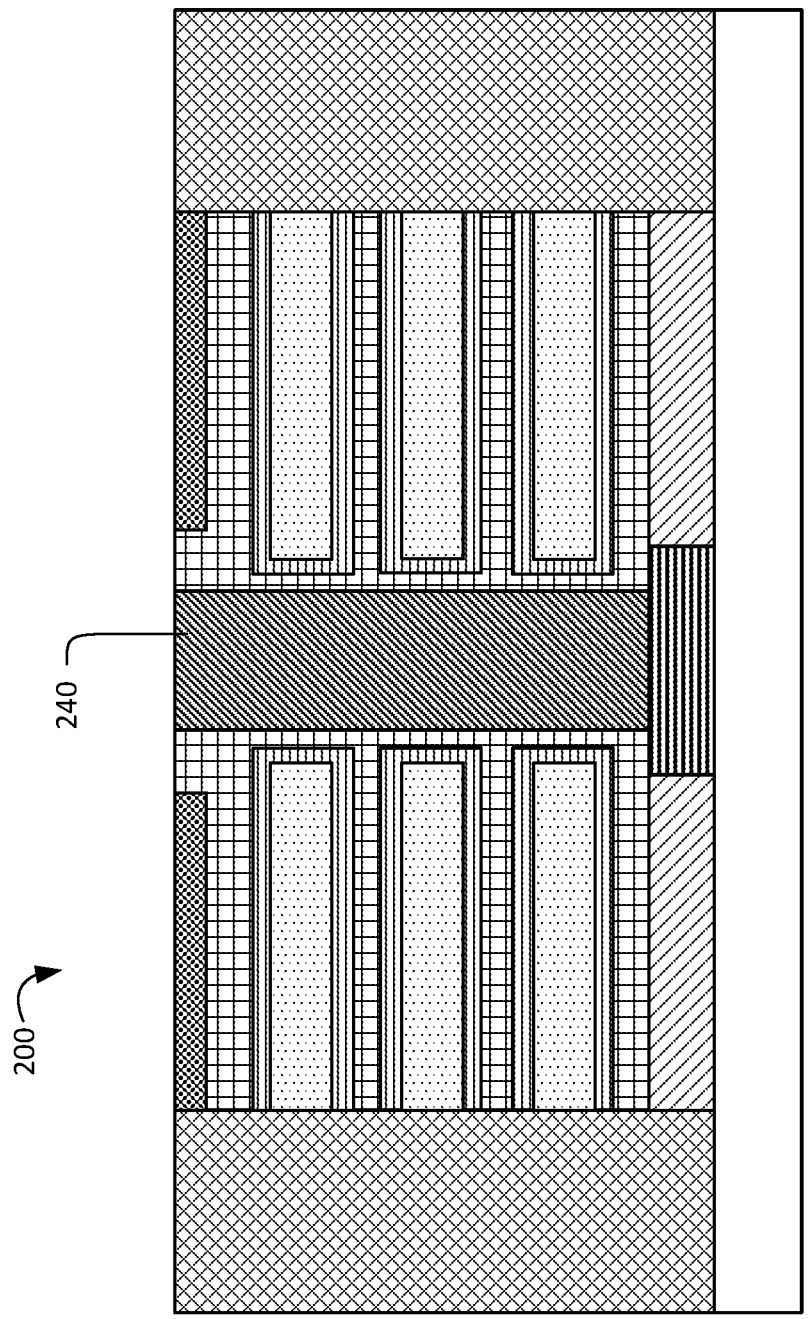
FIG. 8 illustrates a cross sectional view of a semiconductor device during various fabrication stages, made by the method of FIG. 1, in accordance with some embodiments.

FIG. 8 is a cross sectional view of the semiconductor device 200 in which a dielectric spacer 240 is formed between channel regions 236. This operation, like other operations described herein, can be omitted, substituted, or modified. For example, embodiments maintaining an electrical connection between the laterally offset channel regions 236 can omit this dielectric spacer 240. The dielectric spacer 240 can be formed according to a similar process as the body dielectric. For example, the center of the vertical portion 234 of the gate electrode 230 can be masked and etched to form a cavity, and thereafter filled with the dielectric, and planarized along an upper surface of the semiconductor device 200. The dielectric of the dielectric spacer 240 can be a same dielectric of the body dielectric or another dielectric of the semiconductor device 200.

Figure 9:
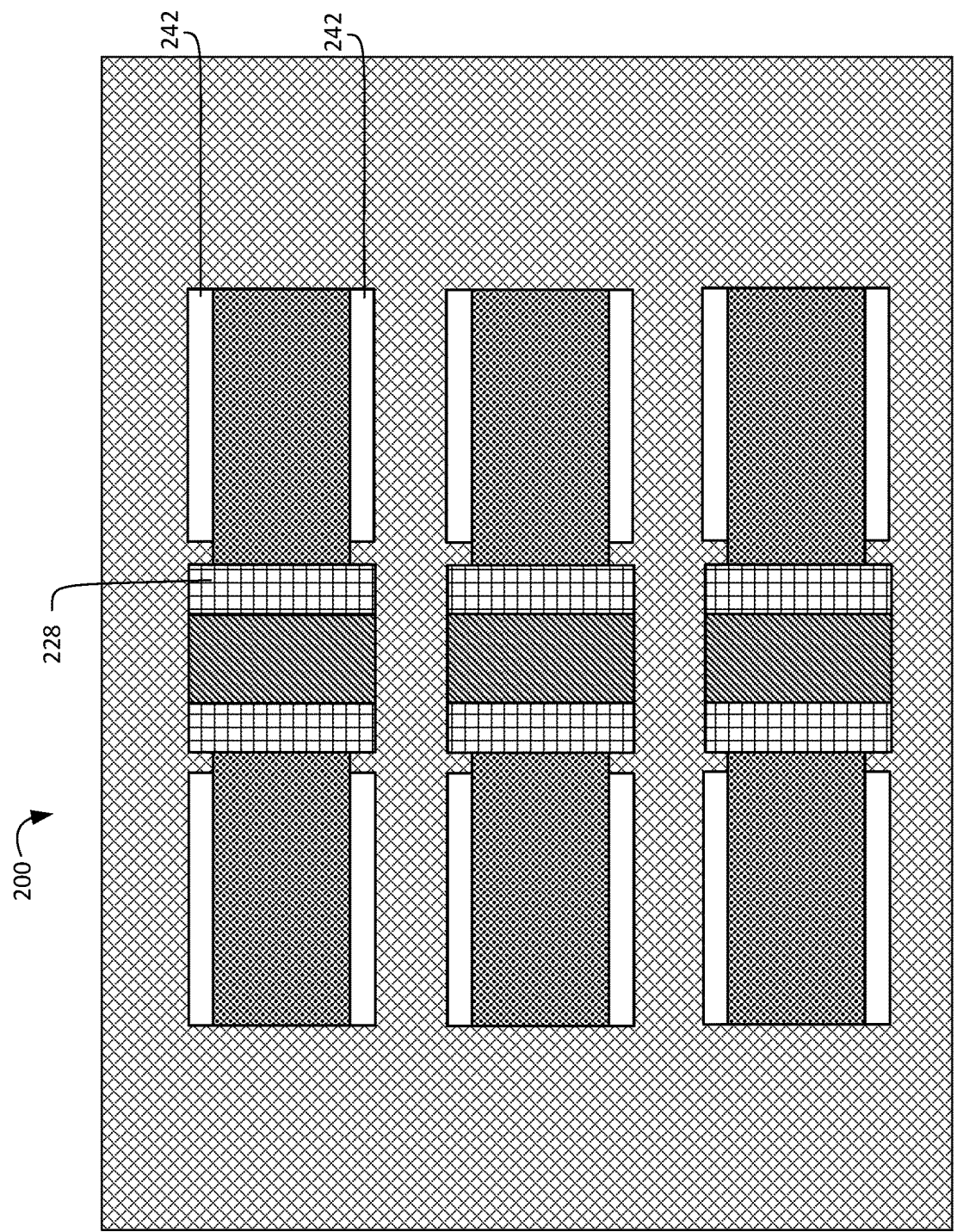
FIG. 9 illustrates a top view of a semiconductor device during various fabrication stages, made by the method of FIG. 1, in accordance with some embodiments.

Corresponding to operation 112 of FIG. 1, FIG. 9 is a top view of the semiconductor device 200 in which second openings 242 are formed, in accordance with various embodiments. As shown in FIG. 5, the second openings 242 are formed in the semiconductor device 200 by directionally etching the surface of the semiconductor device 200 toward the substrate 202. For example, a mask (not depicted) can define the openings, and the openings can thereafter be formed according to a similar operation as operation 104. The second openings 242 can be disposed along one or more layers of the semiconductor device 200. The second openings 242 can expose the substrate 202 as viewed from the top of the device, or the isolating dielectric material 216 or center isolating dielectric 218. For example, the second openings 242 can extend at least to the upper surface of the isolating dielectric material 216 or center isolating dielectric 218 of the semiconductor device 200, which may ease an egress of the etched material from the second openings 242. The second openings 242 can extend for all or a portion of the lateral dimensions of the gate electrode 230.

Figure 10:
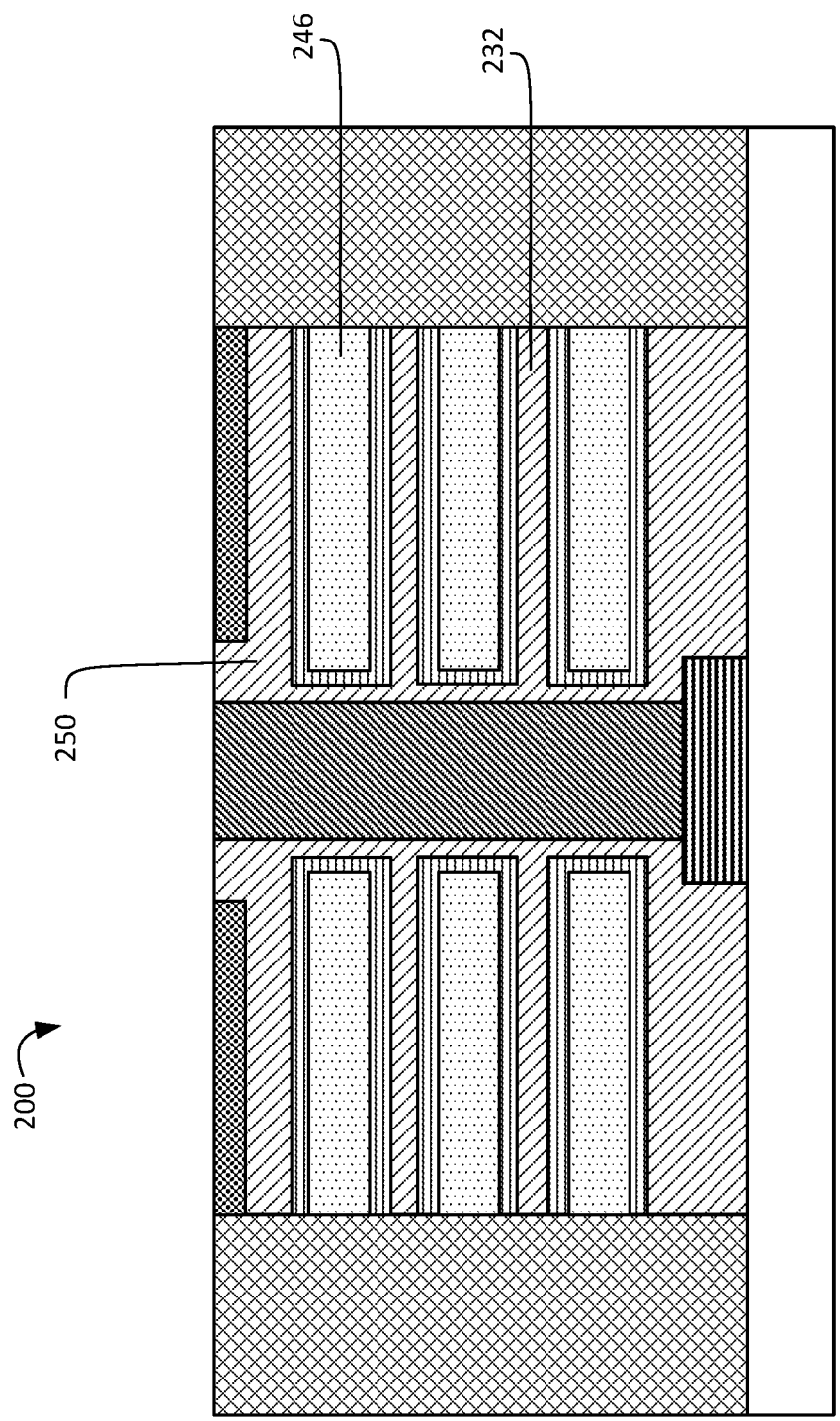
FIG. 10 illustrates a cross sectional view of a semiconductor device during various fabrication stages, made by the method of FIG. 1, in accordance with some embodiments.

Corresponding to operation 114 of FIG. 1, FIG. 10 is a cross sectional view of the semiconductor device 200 in which the gate electrodes 230 are selectively horizontally etched, in accordance with various embodiments. An etchant can be introduced, through the second openings 242 to recess etch the gate electrode 230 or a portion thereof (e.g., at least the horizontal portion 232). The etchant can selectively etch one or more portions (e.g., coatings or thicknesses) of the gate electrode 230 (e.g., can be material specific or time or volume controlled to etch a defined lateral distance of the respective layers). The recess etching laterally reduces the dimension of the gate electrode 230. The reduction in lateral dimension can create isolation between the opposite ends of the channel region 236 of the semiconductor device 200. The recess can define a source region 246 and a drain region 248 (not depicted, located laterally opposite of the channel region 236 from the depicted source region 246), extending beyond the gate electrode (e.g., corresponding to the dimension of the etched portion of the gate electrode 230).

A gate insulating dielectric 250 is formed in the recessed portion of the gate electrode 230. In some embodiments, the gate insulating dielectric 250 can fill the second openings 242. For example, the gate insulating dielectric 250 can be formed according to the process described with references to the body dielectric. In some embodiments, the gate insulating dielectric 250 can be a same dielectric as the body dielectric. In some embodiments, the gate insulating dielectric 250 can be another dielectric material. For example, the gate insulating dielectric 250 can be selected according to an isolation voltage, an interfacability with adjoining materials (e.g., resistance to diffusion of adjoining materials), or dielectric constant (e.g., may be a low-k dielectric to reduce a capacitance). Although, as depicted in FIG. 10, only the gate insulating dielectric 250 surrounding the source region 246 is visible, the gate insulating dielectric 250 can isolate the drain region 248, with the gate electrode 230 disposed therebetween.

Figure 11:
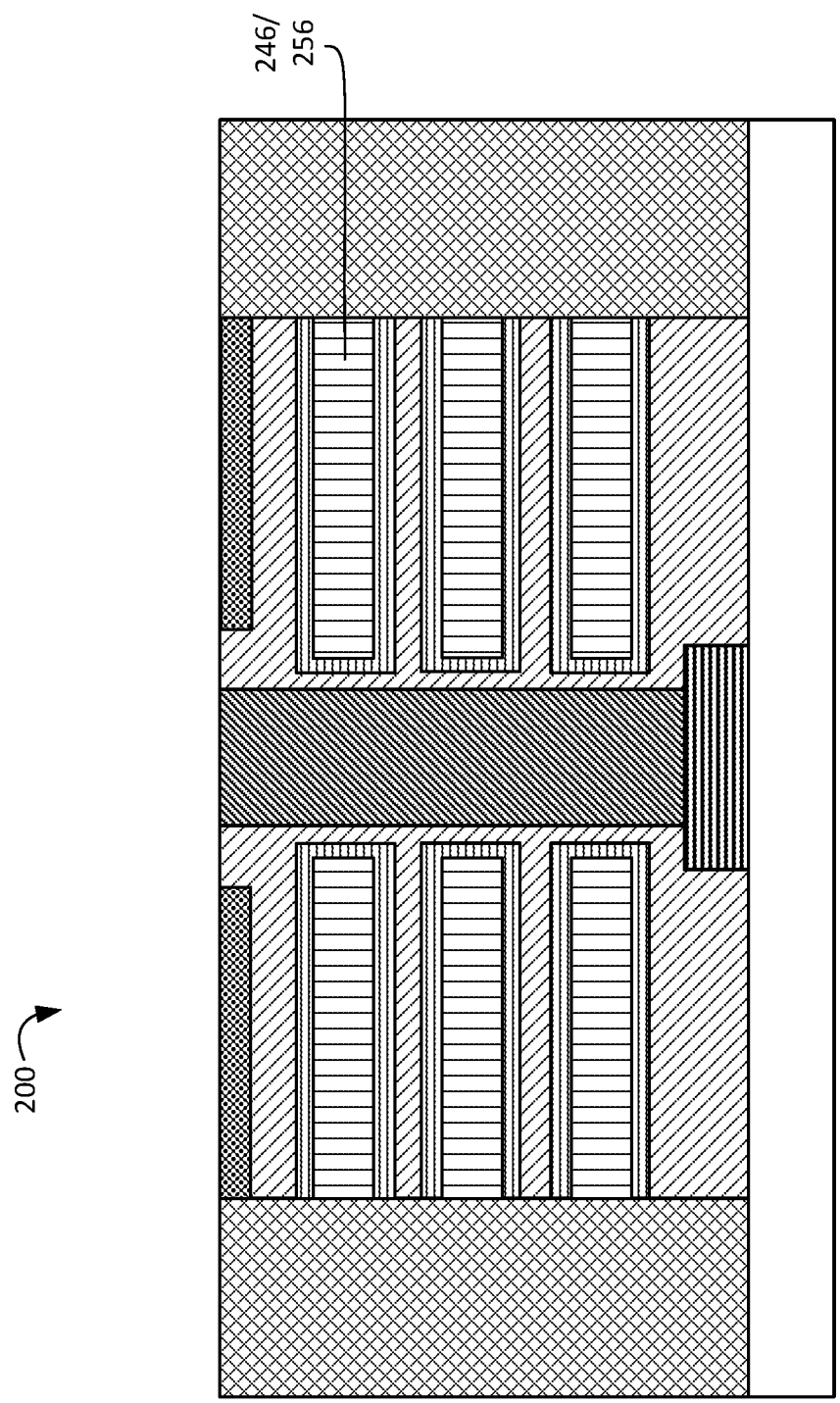
FIG. 11 illustrates a cross sectional view of a semiconductor device during various fabrication stages, made by the method of FIG. 1, in accordance with some embodiments.

Corresponding to operation 116 of FIG. 1, FIG. 11 is a cross sectional view of the semiconductor device 200 in which the source/drain regions 246, 248 are prepared for connection, in accordance with various embodiments. Preparing the source/drain regions 246, 248 for connection can include doping or otherwise treating/activating the source/drain regions 246, 248 for connection to a source or drain electrode, forming or processing the source or drain electrodes for connection to an interconnect structure to interconnect a plurality of transistors, or a formation of another intermediate layer. The disclosed examples are not intended to be limiting. Indeed, the source/drain regions 246, 248 can be prepared according to combinations of the methods disclosed herein, and with other methods known in the art. The description of electrodes herein is not exhaustive. For example, although no figure is directed to a formation of a silicide to join the source/drain regions 246, 248 to a source/drain electrode, such an operation is within the scope of the present disclosure.

As depicted in FIG. 11, the source/drain regions 246, 248 can be doped (e.g., via the second openings 242 or additional openings), in accordance with various embodiments. For example, the source/drain regions 246, 248 can be doped by a plasma doping process. In some embodiments, a dopant can be deposited (e.g., selectively deposited) over the source/drain regions 246, 248, and can thereafter dope the source/drain regions 246, 248 by a diffusion process (e.g., according to a time-temperature profile). In some embodiments, a plurality of doping operations or dopants can be employed, such as to create a dopant profile along each of the source region 246, drain region 248, or channel region 236. For example, the channel can be intrinsic silicon or can be doped to a same or different type as the source and drain (e.g., the source, channel, and drain can be doped N-P-N, or P-N-P, respectively). One or more dopants or processes can form a lightly doped region, and another dopant or process can form a more heavily doped region (e.g., of a same or different type).

An additional semiconductor material 256 can be formed over at least a portion of source/drain regions 246, 248. For example, the source/drain regions 246, 248 can be or include silicon and additional silicon can be epitaxially grown there-over. In some embodiments, the additional semiconductor material 256 can be grown over each of the source/drain regions 246, 248 such that the additional semiconductor material 256 merges to form a contiguous semiconductor region over a plurality of the source/drain regions 246, 248. For example, the vertically disposed source/drain regions 246, 248 can each be in electrical contact with a contiguous epitaxially grown region. In some embodiments, (e.g., embodiments lacking a dielectric spacer 240), the horizontally disposed source/drain regions 246, 248 can be in electrical contact with a contiguous epitaxially grown region.

The additional semiconductor material 256 can be doped, (e.g., heavily, to electrically connect the source/drain regions to an interconnect structure or additional source or drain electrode 258). For example, a dopant can be introduced during or following the epitaxial growth. The dopant can be a p-type or n-type dopant. The reverse side (not depicted) of the semiconductor device 200 can include a same additional semiconductor material 256 such that the sources and drains of each transistor of the depicted pair of transistors can have common drains and sources. The dimensions of the additional semiconductor material 256 can vary (e.g., can be disposed over all or a portion of the portion of the drain/source regions 246, 248). For example, a larger opening may increase a horizontal dimension of the additional semiconductor material 256, which may reduce a resistance thereof (e.g., to or from electrodes or pads disposed on an upper surface of the semiconductor device 200).

Figure 12:
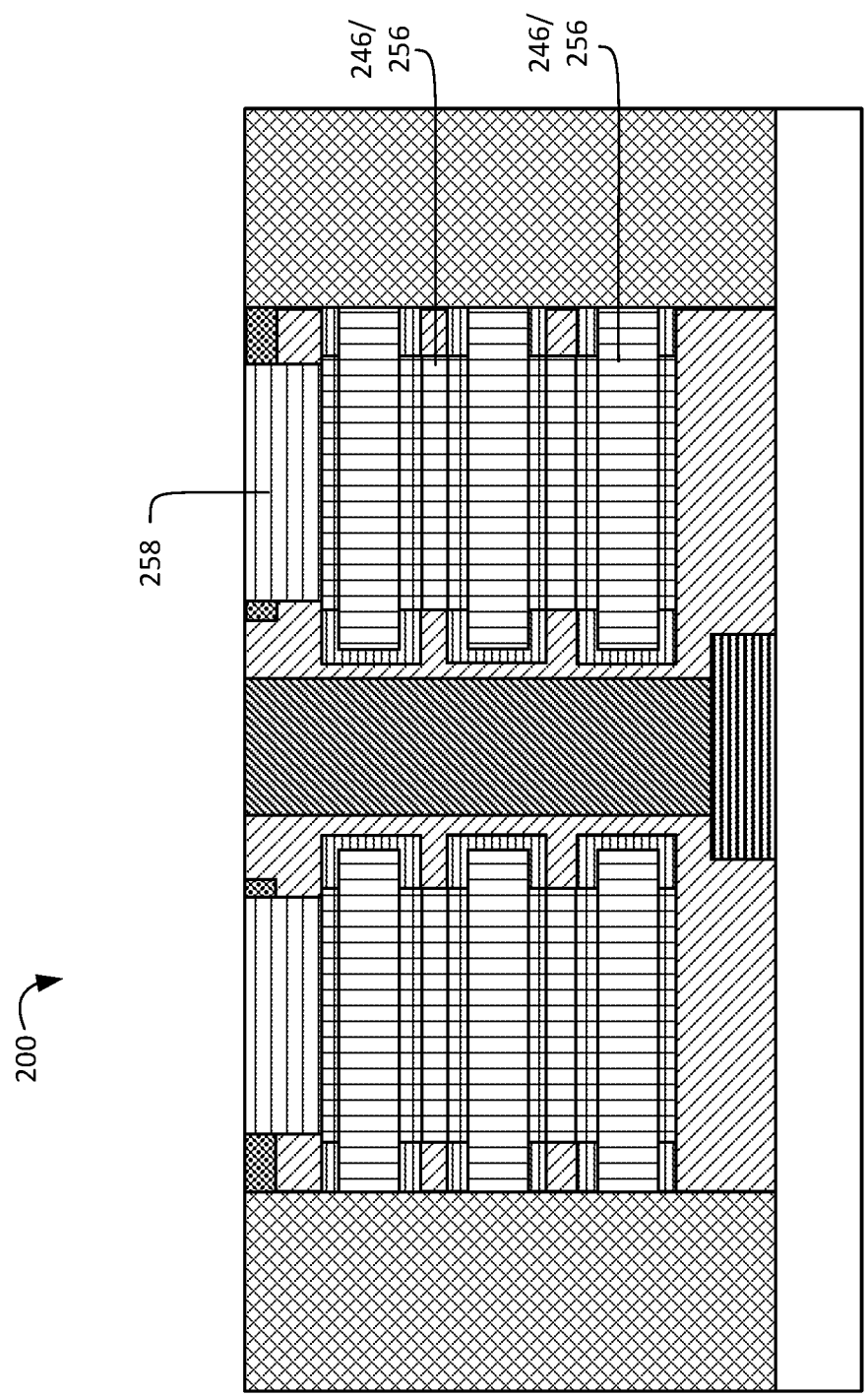
FIG. 12 illustrates a cross sectional view of a semiconductor device during various fabrication stages, made by the method of FIG. 1, in accordance with some embodiments.

Corresponding to operation 118 of FIG. 1, FIG. 12 is a cross sectional view of the semiconductor device 200 in which the drain/source electrodes 258 are formed, in accordance with various embodiments. The electrodes can be formed by a deposition process for a metal, such as a selective or nonselective deposition, followed by a CMD/G process to remove excess material. In some embodiments, additional or fewer drain/source electrodes 258 can be formed. For example, in some embodiments (e.g., embodiments lacking a contiguous source/drain region 246, 248 across the plurality of layers of the semiconductor device 200), each lateral portion of the semiconductor layer 208 can have a laterally spaced electrode connecting to the source/drain region 246, 248. In embodiments, such as those lacking a dielectric spacer 240 having a single gate electrode, a single source/drain electrode 258 can be formed.

Figure 13:
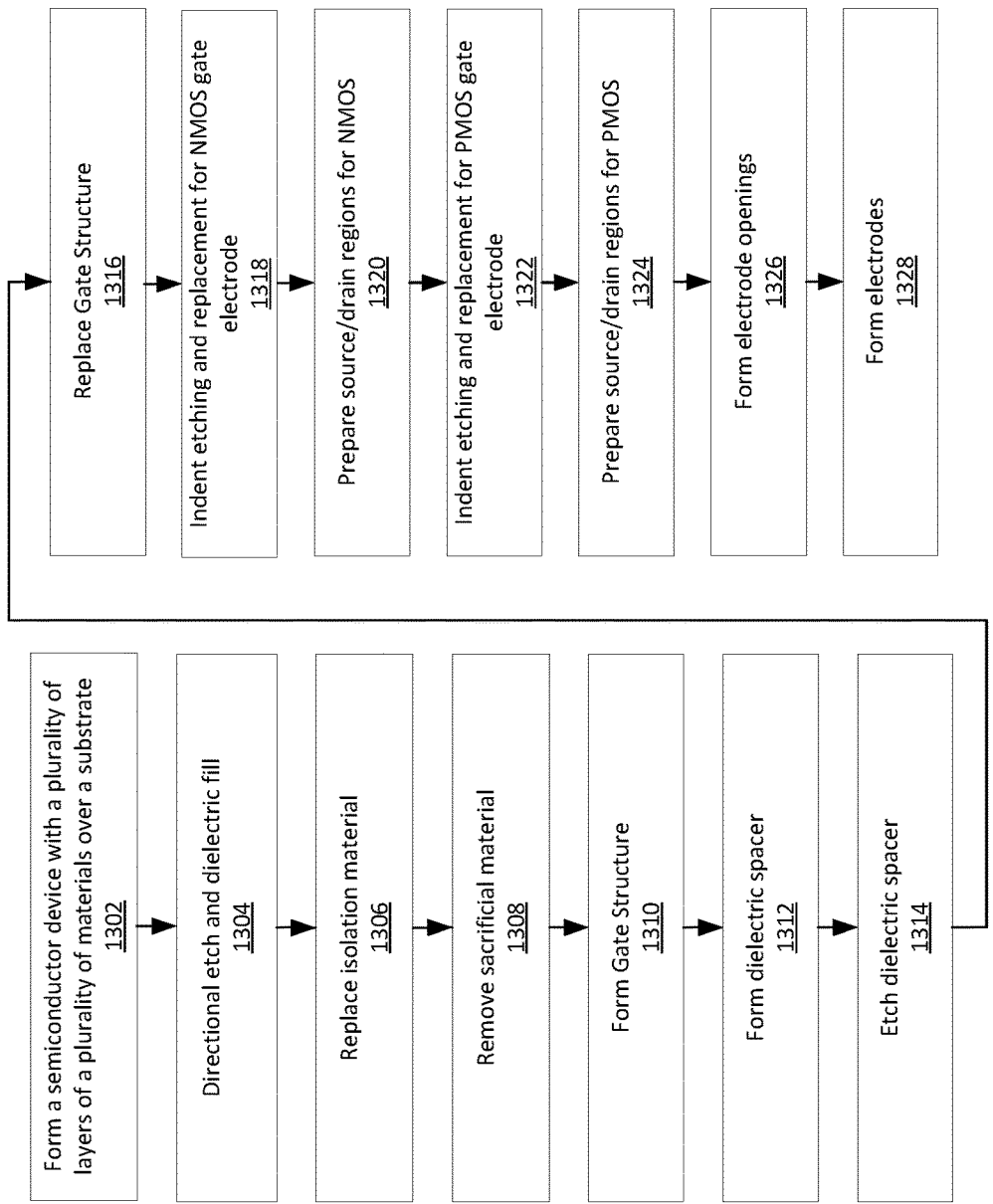
FIG. 13 is a flow chart of a method for making a semiconductor device, in accordance with some embodiments.

FIG. 13 illustrates a flow chart of a method 1300 for making a complementary transistor pair, based on a vertical stack structure. For example, the vertical stack structure can be formed by a plurality of nanosheets to form a semiconductor device 200. The vertical stack structure can include two columns of channels, without an electrical connection therebetween. In some embodiments, the two columns of transistors can be connected by an additional operation, such as along a surface of the semiconductor device 200. In some embodiments, respective transistors can be disconnected (e.g., can be independently operated in separate circuits). It is noted that the method 1300 is merely an example, and is not intended to limit the present disclosure. Accordingly, it is understood that additional operations may be provided before, during, and after the method 1300 of FIG. 13, and that some other operations may only be briefly described herein.

In various embodiments, operations of the method 1300 may be associated with cross-sectional views of an example semiconductor device 200 at various fabrication stages as shown in FIGS. 14 to 19, which will be discussed in further detail below. It should be understood that the semiconductor device 200, shown in FIGS. 14 to 19, may include a number of other devices such as inductors, fuses, capacitors, coils, etc., while remaining within the scope of the present disclosure.

In brief overview, the method 1300 starts with operation 1302 of forming a semiconductor device comprising a plurality of materials formed over a substrate. The method 1300 continues to operation 1304 of directionally etching a portion of the semiconductor device, and filling the etched portion with a dielectric fill. The method 1300 proceeds to operation 1306 of isolating a portion of the semiconductor device from the substrate. The method 1300 proceeds to operation 1308 of removing a sacrificial material. The method 1300 proceeds to operation 1310 of forming a gate structure over the semiconductor layers. The method 1300 proceeds to operation 1312 of forming a dielectric spacer. At operation 1314, the dielectric spacer is etched. At operation 1316, a gate structure is replaced for a portion of the semiconductor channels. At operation 1318, at least the horizontal portions of the gate electrode are selectively horizontally etched (e.g., indent etched) for at least one gate. At operation 1320, the source/drain regions are prepared for connection such as by doping or a connection of metal electrodes for at least one set of semiconductor channels. At operation 1322, at least the horizontal portions of another gate electrode are selectively horizontally etched (e.g., indent etched). At operation 1324, source/drain regions are prepared for connection. At operation 1326, electrode openings are formed. At operation 1328, electrodes are formed to connect to the source/drain regions.

Various operations depicted in FIG. 13 may be similar to other operations depicted in this disclosure. For example, in various embodiments, the operations 1302, 1304, 1306, 1308, 1310, 1320/1324 and 1326 may be performed in a fashion as has previously been discussed with regard to operations 102, 104, 106, 108, 110, 116, 118 as depicted in FIG. 1; operation 1312 can be performed as has previously been discussed with regard to FIG. 7.

Figure 14:
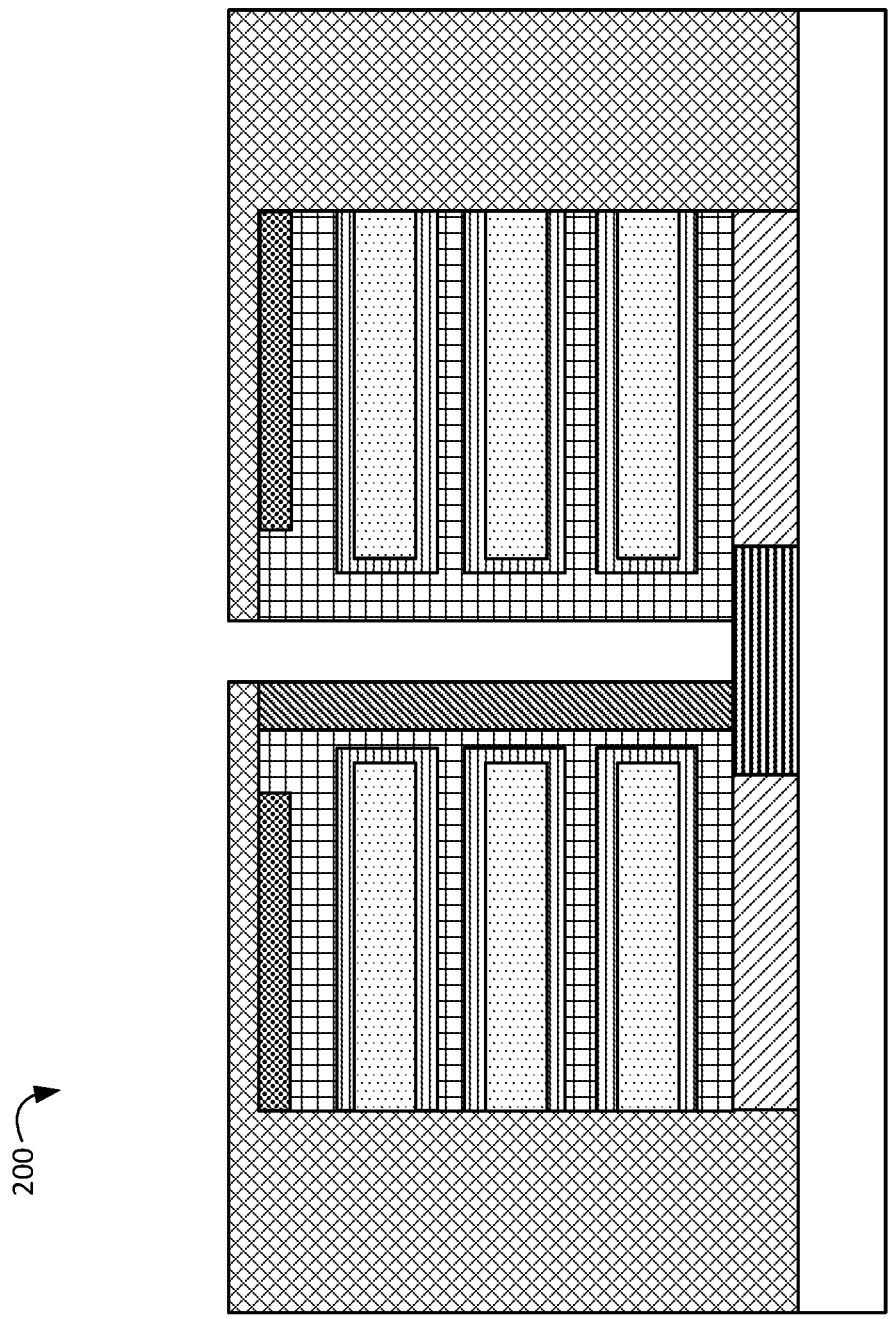
FIG. 14 illustrates a cross sectional view of a semiconductor device during various fabrication stages, made by the method of FIG. 13, in accordance with some embodiments.

Corresponding to operation 1314 of FIG. 13, FIG. 14 is a cross sectional view of the semiconductor device 200 in which the dielectric spacer 240 is masked and etched to the substrate or the center isolating dielectric 218, in accordance with various embodiments. The dielectric spacer 240 can be formed according to the disclosure provided with regard to operation 114. The etching of the dielectric spacer 240 can open the gate electrode 230 to the surface of the semiconductor device 200.

Figure 15:
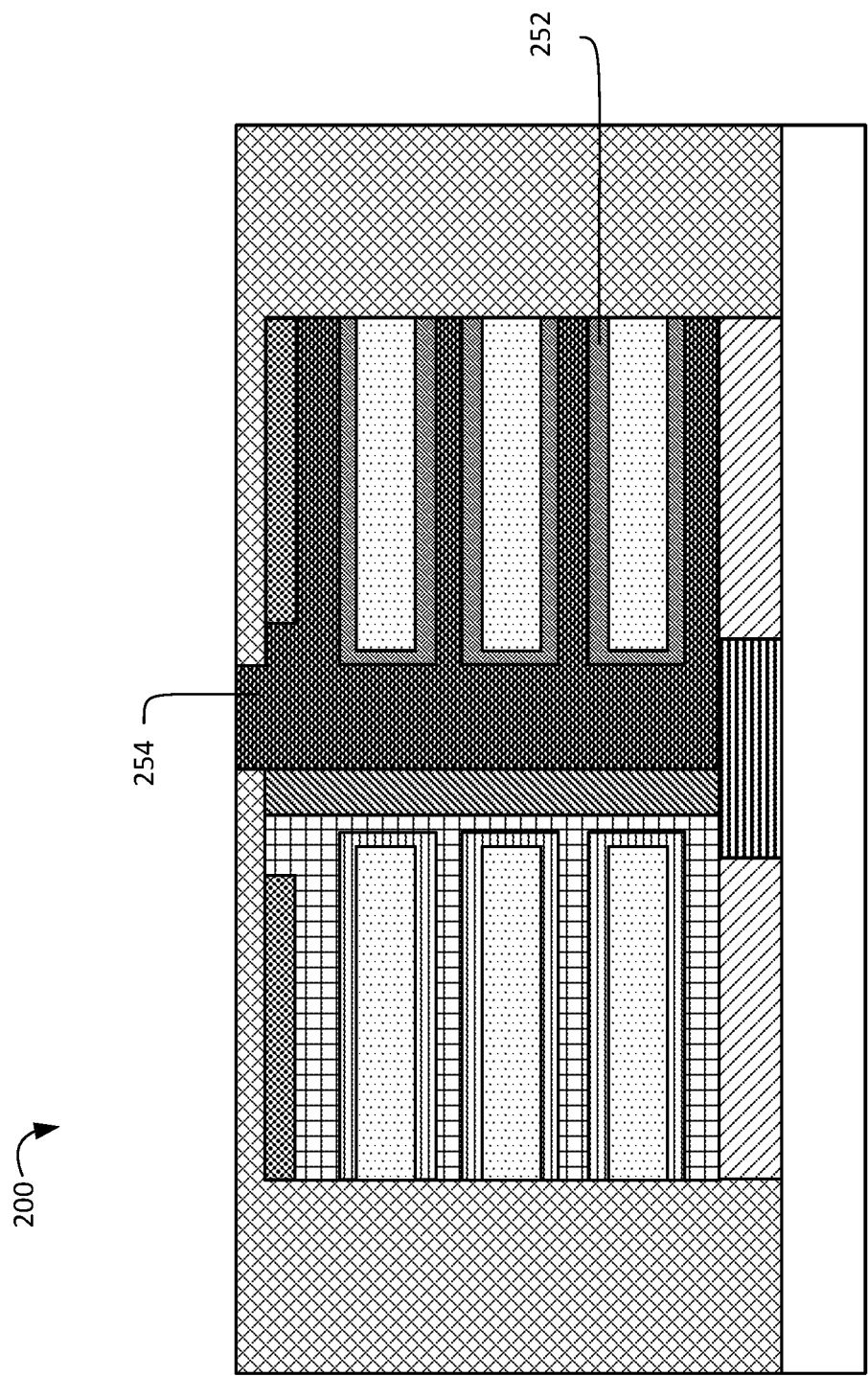
FIG. 15 illustrates a cross sectional view of a semiconductor device during various fabrication stages, made by the method of FIG. 13, in accordance with some embodiments.
Figure 16:
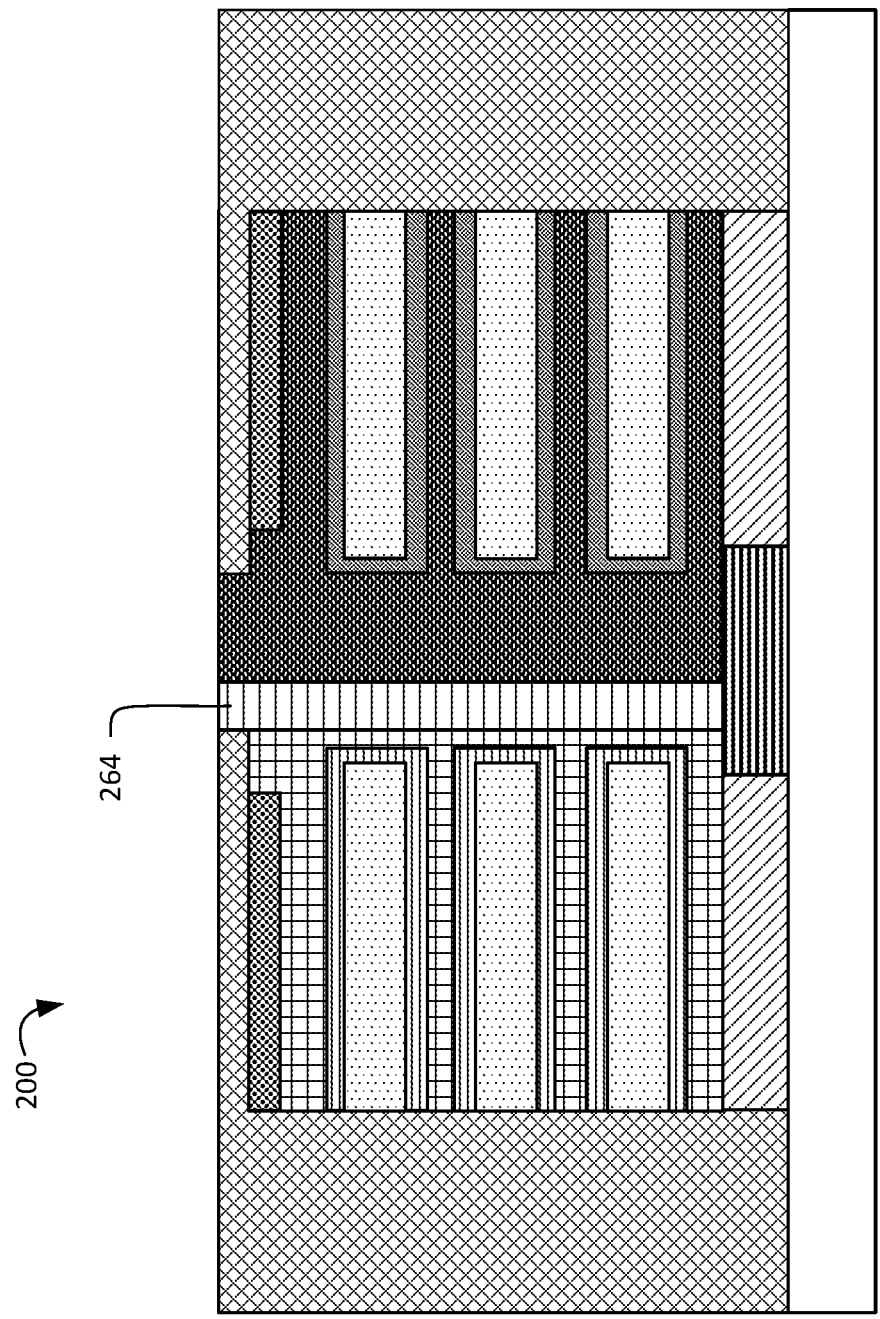
FIG. 16 illustrates a cross sectional view of a semiconductor device during various fabrication stages, made by the method of FIG. 13, in accordance with some embodiments.

Corresponding to operation 1316 of FIG. 13, FIG. 15 is a cross sectional view of the semiconductor device 200 in which a gate structure including the gate dielectric 228 and the gate electrode 230 is replaced with a PMOS gate structure, in accordance with various embodiments. For example, an etchant can be introduced via the removed portion of the dielectric spacer 240 to remove the gate electrode 230 and gate dielectric 228 disposed over at least a portion of the source/drain regions 246, 248 (e.g., as depicted, the rightmost source/drain regions 246, 248). A PMOS gate dielectric 252 and a PMOS gate electrode 254 is formed over the channel regions 236, such as according to the disclosure of operation 110. The description of the PMOS gate dielectric 252 and PMOS gate electrode 254 is not intended to be limiting. For example, according to some embodiments, the gate formed at operation 1310 can be a p-type, and thereafter be replaced with an n-type gate structure. In some embodiments, such as the embodiment depicted in FIG. 16, a conductive gate coupler 264 can be formed between the PMOS gate structure and an NMOS gate structure to form a complementary FET pair. For example, the conductive gate coupler 264 can be disposed laterally between the respective gates (as depicted), or along a surface of the semiconductor device 200.

Figure 17:
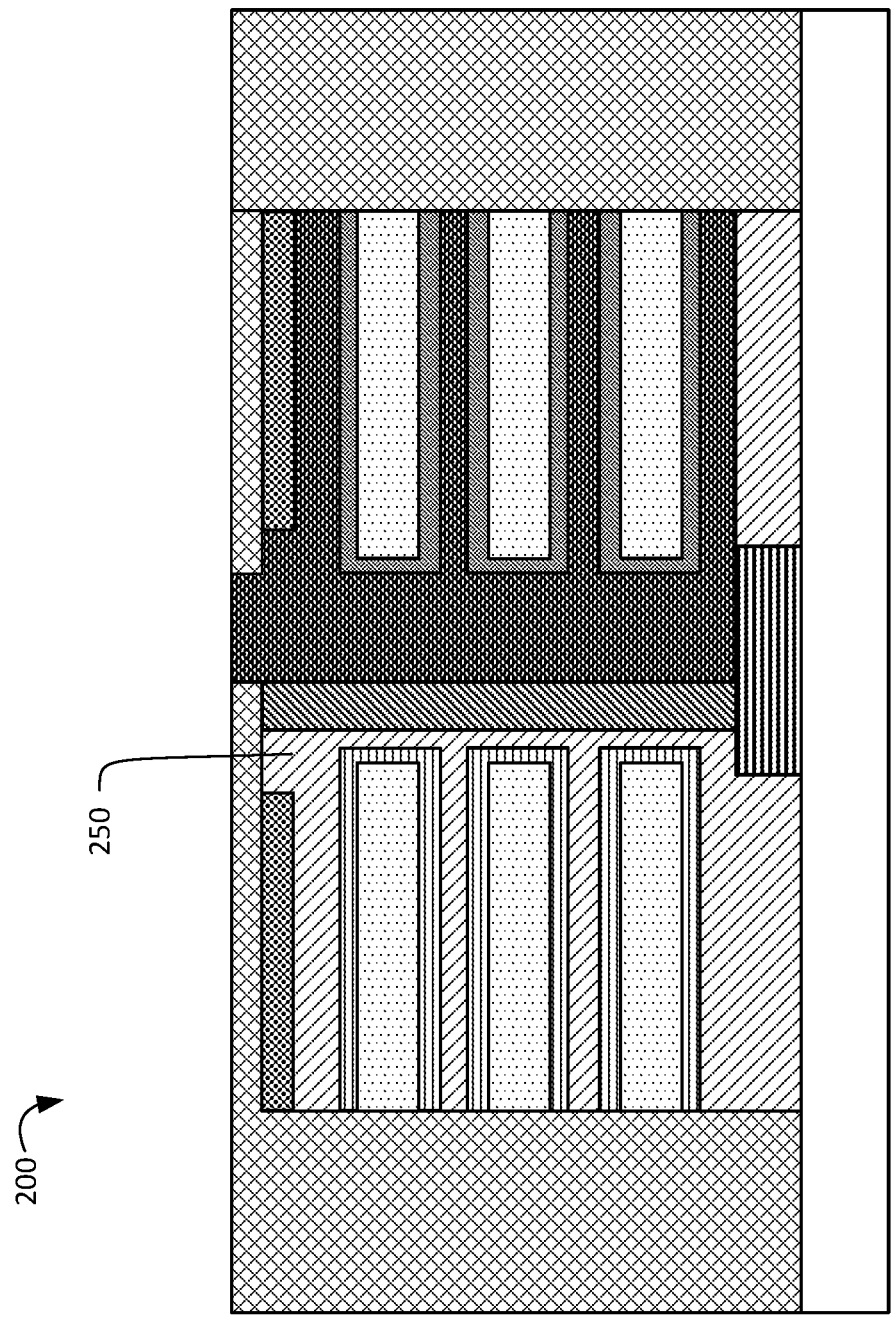
FIG. 17 illustrates a cross sectional view of a semiconductor device during various fabrication stages, made by the method of FIG. 13, in accordance with some embodiments.
Figure 18:
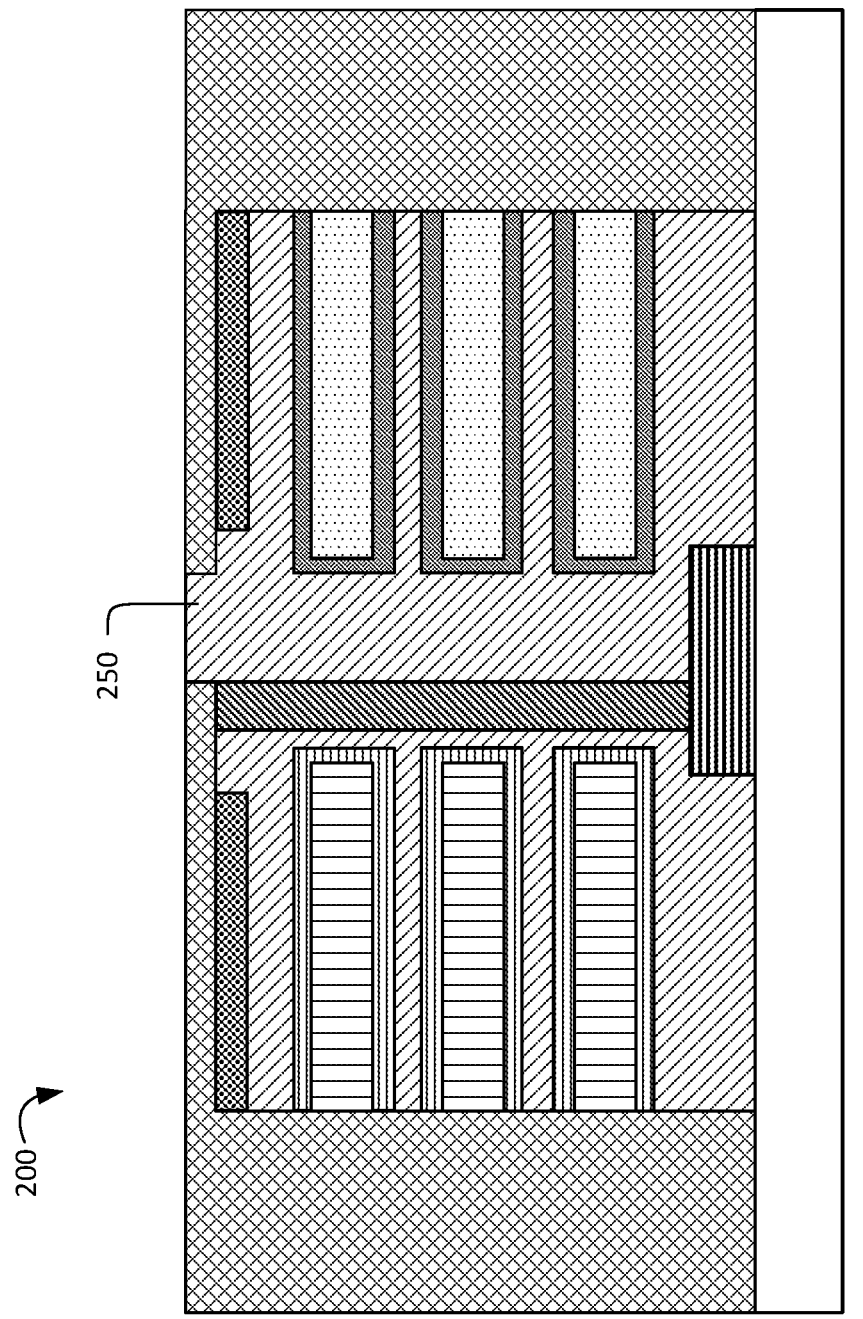
FIG. 18 illustrates a cross sectional view of a semiconductor device during various fabrication stages, made by the method of FIG. 13, in accordance with some embodiments.

Corresponding to operation 1318 of FIG. 13, FIG. 17 is a cross sectional view of the semiconductor device 200 in which the gate electrode 230 is selectively horizontally etched, in accordance with various embodiments. The horizontally etched portions can be replaced with a dielectric (e.g., a gate insulating dielectric 250). The gate insulating dielectric 250 can be formed on the visible plane of FIG. 18, including the various source regions 246 and another plane containing the drain region 248. For example, the source/drain regions 246, 248 can be defined by the gate insulating dielectric 250 in accordance with the disclosure of operation 114. At operation 1320, the source/drain regions 246, 248 can be prepared according to the disclosures surrounding operation 118. Corresponding to operation 1322 of FIG. 13, FIG. 18 depicts a similar operation as operation 1318, for the PMOS electrode, which can be combined with operation 1324 of preparing the source/drain regions 246, 248 of the PMOS electrode.

Figure 19:
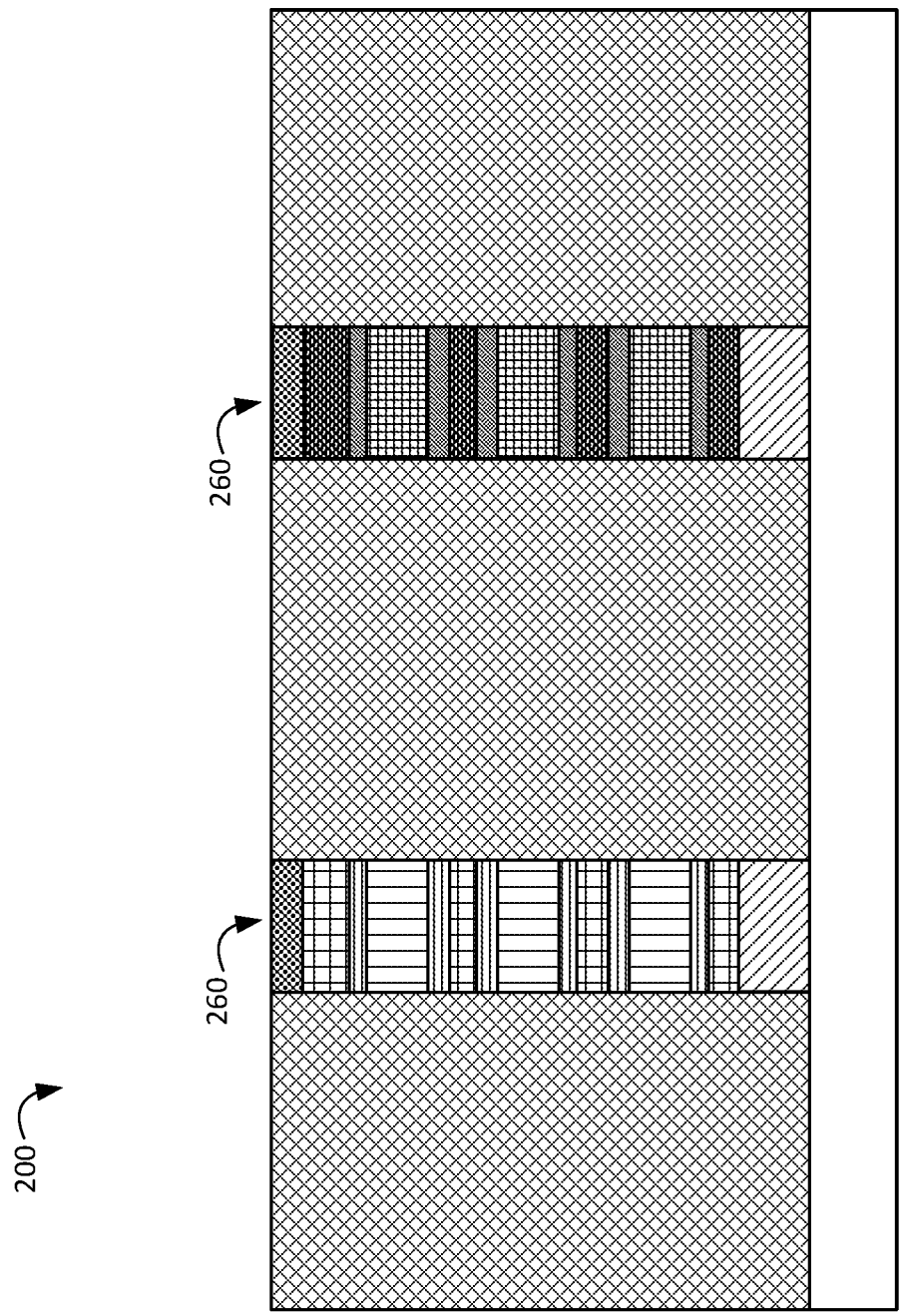
FIG. 19 illustrates a cross sectional view of a semiconductor device during various fabrication stages, made by the method of FIG. 13, in accordance with some embodiments.

Corresponding to operation 1326 of FIG. 13, FIG. 19 is a cross sectional view of the semiconductor device 200 in which electrode openings 260 are formed to receive metal electrodes (not depicted). For example, the metal electrodes can be formed for each of one or more source/drain regions 246, 248. For example, the metal electrodes can be deposited, and the upper surface of the semiconductor device can be planarized.

Figure 20:
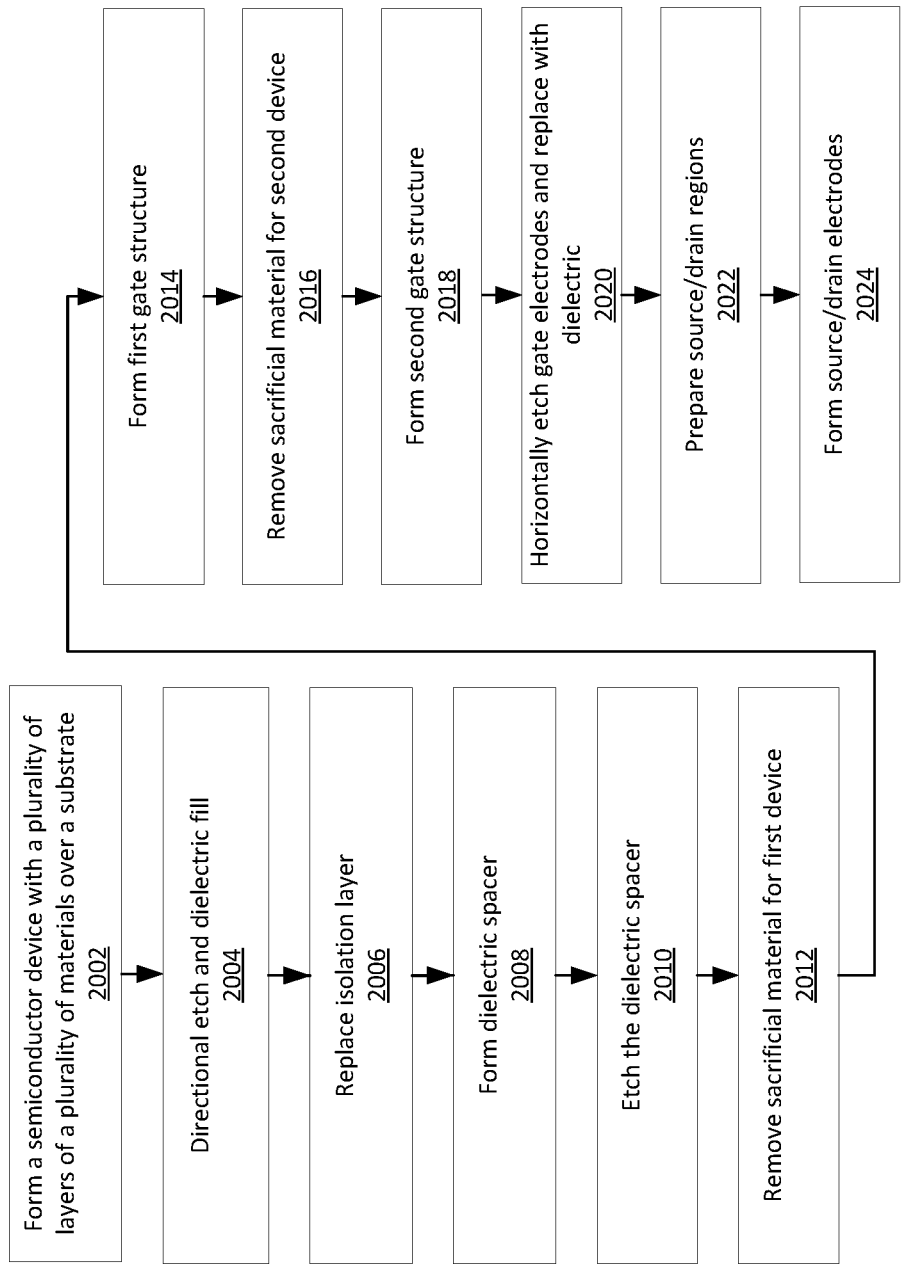
FIG. 20 is a flow chart of a method for making a semiconductor device, in accordance with some embodiments.

FIG. 20 illustrates a flow chart of a method 2000 for making a complementary transistor pair, based on a vertical stack structure. For example, the vertical stack structure can be formed by a plurality of nanosheets to form a semiconductor device 200. The vertical stack structure can include two columns of transistors, without an electrical connection therebetween. In some embodiments, the two columns of transistors can be connected by an additional operation, such as along a surface of the semiconductor device 200. In some embodiments, respective transistors can be disconnected (e.g., can be independently operated in separate circuits). It is noted that the method 2000 is merely an example, and is not intended to limit the present disclosure. Accordingly, it is understood that additional operations may be provided before, during, and after the method 2000 of FIG. 20, and that some other operations may only be briefly described herein.

In various embodiments, operations of the method 2000 may be associated with cross-sectional views of an example semiconductor device 200 at various fabrication stages as shown in FIGS. 21 to 25, which will be discussed in further detail below. It should be understood that the semiconductor device 200, shown in FIGS. 21 to 25, may include a number of other devices such as inductors, fuses, capacitors, coils, etc., while remaining within the scope of the present disclosure.

In brief overview, the method 2000 starts with operation 2002 of forming a semiconductor device comprising a plurality of materials formed over a substrate. The method 2000 continues to operation 2004 of directionally etching a portion of the semiconductor device, and filling the etched portion with a dielectric fill. The method 2000 proceeds to operation 2006 of isolating a portion of the semiconductor device from the substrate. The method 2000 proceeds to operation 2008 of forming a dielectric spacer. The method 2000 proceeds to operation 2010 of removing a portion of the dielectric spacer. The method 2000 proceeds to operation 2012 of removing a sacrificial material for a first device. The method 2000 proceeds to operation 2014 of forming a first gate structure over the semiconductor channels. The method 2000 proceeds to operation 2016 of removing a sacrificial material for a second device. At operation 2018, the second gate structure is formed. At operation 2020, the respective gates are horizontally etched and replaced with a dielectric. At operation 2022, the source/drain regions are prepared. At operation 2024, electrodes are formed to connect to the source/drain regions.

Various operations depicted in FIG. 20 may be similar to other operations depicted in this disclosure. For example, in various embodiments, the operations 2002, 2004, 2006, 2014/2018, 2020, 2022, 2024 may be performed in a fashion as has previously been discussed with regard to operations 102, 104, 106, 1316, 114, 116, 118 as depicted in FIGS. 1 and 13 (e.g., in whole or in part).

Figure 21:
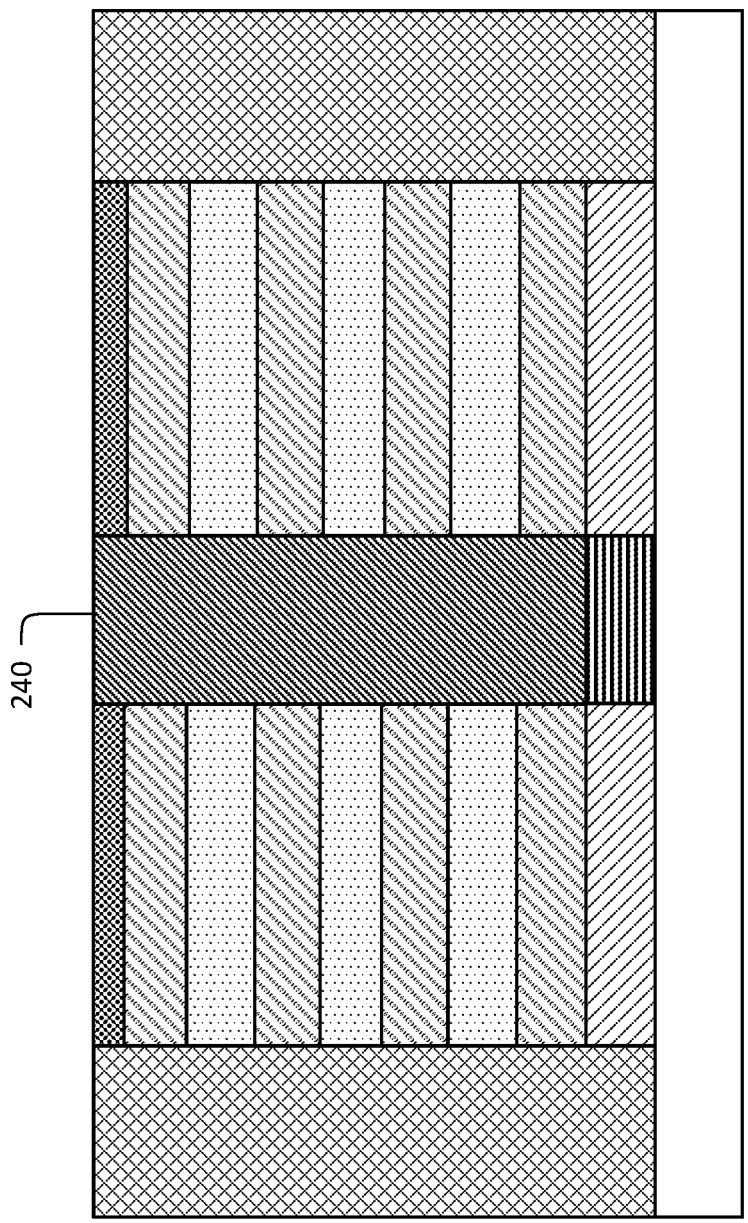
FIG. 21 illustrates a cross sectional view of a semiconductor device during various fabrication stages, made by the method of FIG. 20, in accordance with some embodiments.

Corresponding to operation 2008 of FIG. 20, FIG. 21 is a cross sectional view of the semiconductor device 200 in which the dielectric spacer 240 is formed between respective devices. For example, the dielectric spacer 240 can be formed between respective stacks of the layers. For example, the dielectric spacer 240 can be formed according to a same process as the dielectric spacer 240 of FIG. 8.

Figure 22:
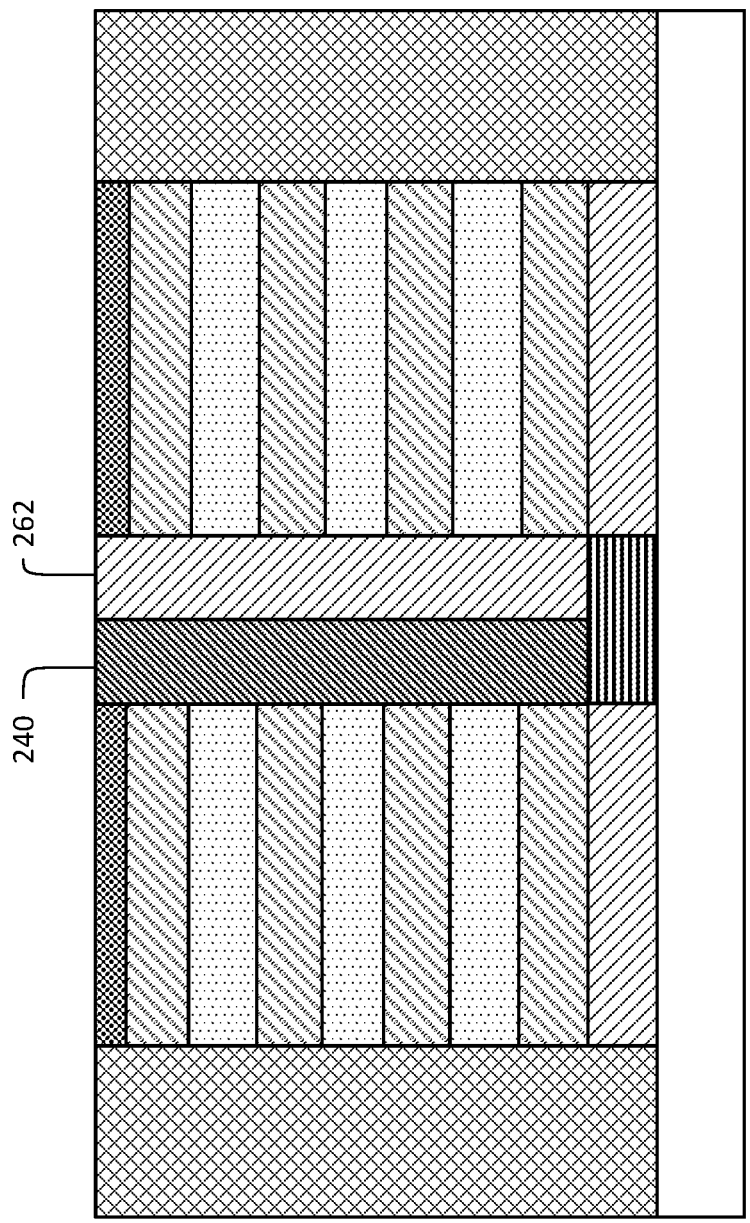
FIG. 22 illustrates a cross sectional view of a semiconductor device during various fabrication stages, made by the method of FIG. 20, in accordance with some embodiments.

Corresponding to operation 2010 of FIG. 20, FIG. 22 is a cross sectional view of the semiconductor device 200 in which a portion of the dielectric spacer 240 is removed. For example, the dielectric spacer 240 can be vertically etched and replaced with another material. For example, the additional material can be a temporary spacer 262, which can be a same material as the isolating dielectric material 216 or a can be resistive to a same etchant as the isolating dielectric material 216.

Figure 23:
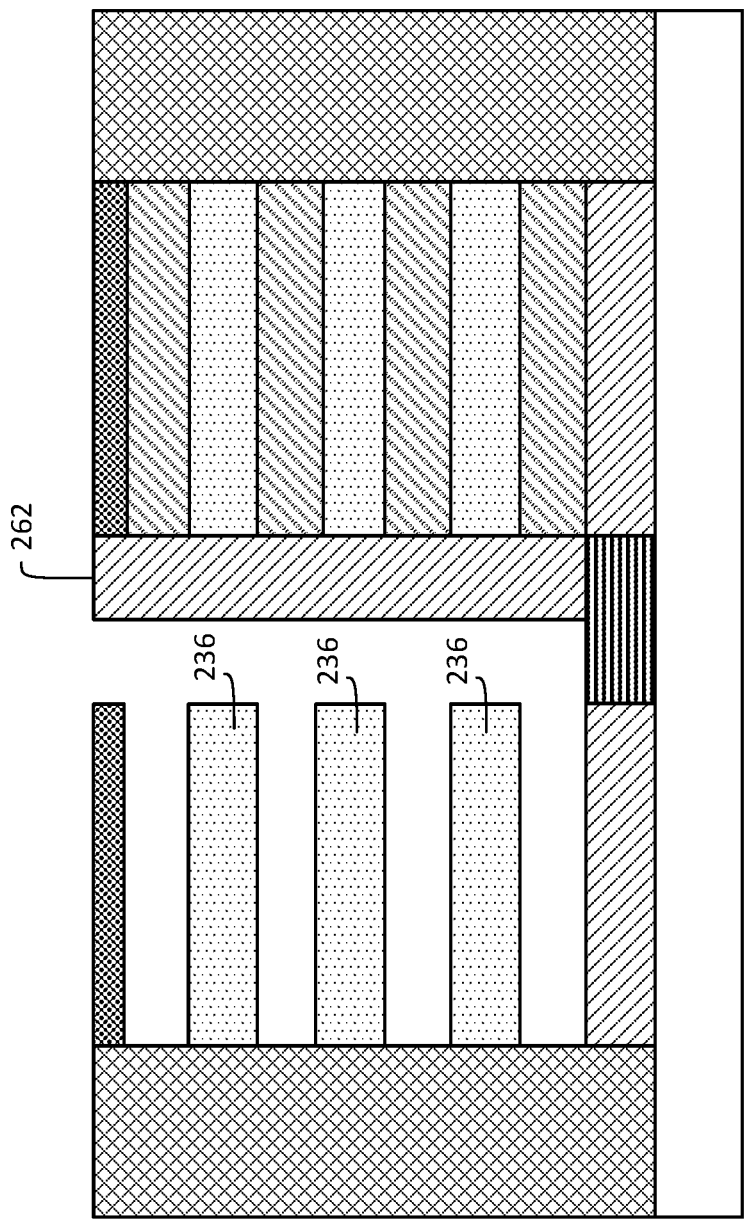
FIG. 23 illustrates a cross sectional view of a semiconductor device during various fabrication stages, made by the method of FIG. 20, in accordance with some embodiments.

Corresponding to operation 2012 of FIG. 20, FIG. 23 is a cross sectional view of the semiconductor device 200 in which the sacrificial material is removed for a first device (e.g., a transistor formed from the exposed channel regions 236), in accordance with various embodiments. For example, the sacrificial material can be removed from the channel regions 236 in a similar fashion as the sacrificial material as described with regard to operation 108 or 1316.

Figure 24:
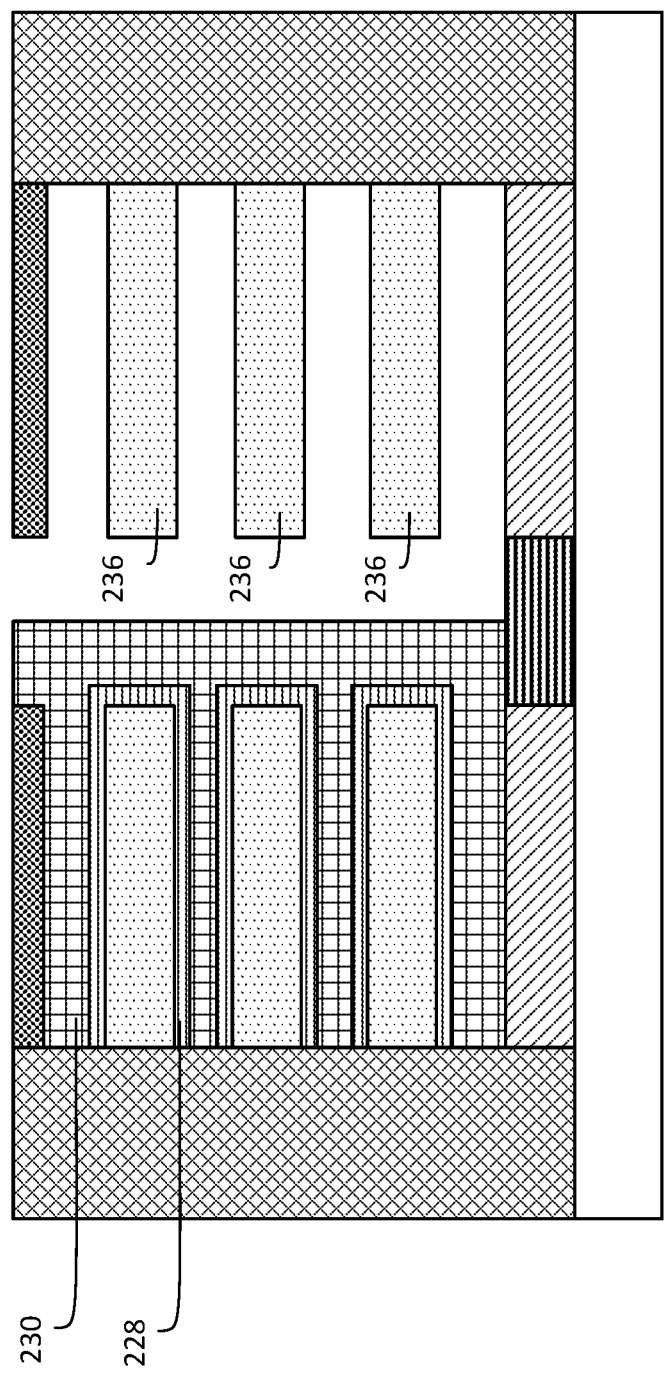
FIG. 24 illustrates a cross sectional view of a semiconductor device during various fabrication stages, made by the method of FIG. 20, in accordance with some embodiments.

Corresponding to operation 2016 of FIG. 20, FIG. 24 is a cross sectional view of the semiconductor device 200 in which the sacrificial material is removed for a second device. Also depicted is a gate structure formed for the first device, the gate structure comprising a gate dielectric 228 and a gate electrode 230. The gate structure can be a gate structure for a n-type transistor or a p-type transistor. For example, the gate structure can be a gate structure of a same or different type than the second device.

Figure 25:
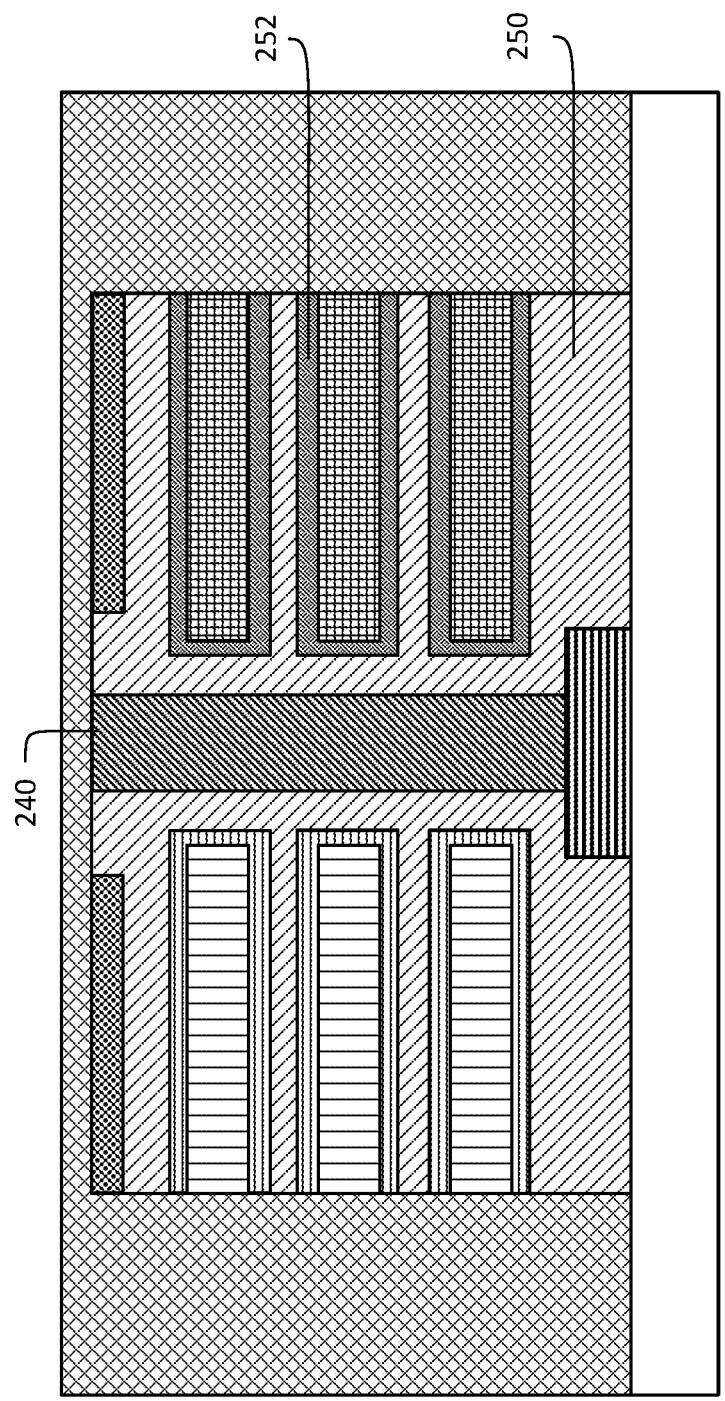
FIG. 25 illustrates a cross sectional view of a semiconductor device during various fabrication stages, made by the method of FIG. 20, in accordance with some embodiments.

FIG. 25 depicts a semiconductor formed according to the method 2000. As depicted, the second device includes another gate electrode including a PMOS gate dielectric 252 and PMOS gate electrode 254 (not depicted, shown behind the depicted gate insulating dielectric 250). As depicted, a dielectric spacer 240 separates the first and second devices. For example, the dielectric spacer 240 can be a remnant of the dielectric spacer 240 of FIG. 21, or can be formed by a directional etch. In some embodiments, the dielectric spacer 240 can be omitted to form an electrical connection between the first and second device (e.g., to form a complementary MOS device from an NMOS device and a PMOS device).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method, comprising:
providing a plurality of first semiconductor channels vertically spaced from one another and a plurality of second semiconductor channels vertically spaced from one another, wherein the plurality of first semiconductor channels each have a first sidewall in contact with a first dielectric structure and the plurality of second semiconductor channels each have a first sidewall in contact with a second dielectric structure, and wherein a second sidewall of each of the plurality of first semiconductor channels and a second sidewall of each of the plurality of second semiconductor channels are exposed by a cavity interposed between the first and second dielectric structures;
forming a first gate structure around at least a top surface, a bottom surface, and the second sidewall of each of the plurality of first semiconductor channels; and
forming a second gate structure around at least a top surface, a bottom surface, and the second sidewall of each of the plurality of second semiconductor channels.

2. The method of claim 1, wherein forming the first gate structure or the second gate structure comprises:
forming a gate dielectric over the plurality of first semiconductor channels and the plurality of second semiconductor channels;
forming a gate electrode over the gate dielectric, the gate electrode comprising:
a plurality of horizontal portions vertically bounding the plurality of first semiconductor channels and the plurality of second semiconductor channels;
a vertical portion connecting the plurality of horizontal portions;
horizontally etching at least the horizontal portions of the gate electrode by:
forming openings to access opposite sidewalls of the horizontal portions of the gate electrode; and
horizontally etching the opposite sidewalls to define:
a plurality of first source regions disposed on an opposite side of the plurality of first semiconductor channels from a plurality of first drain regions; and
a plurality of second source regions disposed on an opposite side of the plurality of second semiconductor channels from a plurality of second drain regions.

3. The method of claim 2, further comprising:
doping the first source regions and first drain regions with an n-type dopant; and
connecting a metal electrode to the first source regions and the first drain regions.

4. The method of claim 1, further comprising:
doping opposite ends of the plurality of first semiconductor channels and the plurality of second semiconductor channels to form a plurality of activated source/drain regions; and
forming a doped semiconductor over the opposite ends of the source/drain regions, to electrically connect thereto.

5. The method of claim 2, wherein a contiguous doped semiconductor is formed over each opposite end of the plurality of first semiconductor channels which connects to each of the plurality of first semiconductor channels.

6. The method of claim 2, wherein the first gate structure and the second gate structure are electrically connected along a vertical boundary thereof.

7. The method of claim 2, wherein:
the first source regions and the first drain regions comprise a n-type semiconductor; and
the second source regions and the second drain regions comprise a p-type semiconductor.

8. The method of claim 2, wherein:
the first source regions and first drain regions comprise an n-type semiconductor; and
the second source regions and the second drain regions comprise a p-type semiconductor.

9. The method of claim 2, wherein the plurality of first semiconductor channels comprise at least three first semiconductor channels, and the plurality of second semiconductor channels comprise at least three of the second semiconductor channels.

10. The method of claim 1, wherein a dielectric spacer is disposed between the first gate structure and the second gate structure to electrically isolate the first gate structure from the second gate structure along a vertical plane therebetween.

11. The method of claim 1, wherein
forming the first gate structure comprises:
   forming a high-k dielectric over at least the top surface, the bottom surface, and the second sidewall of each of the plurality of first semiconductor channels; and
   forming a first gate electrode over the high-k dielectric; and
forming the second gate structure comprises:
   forming the high-k dielectric over at least the top surface, the bottom surface, and the second sidewall of each of the plurality of second semiconductor channels; and
   forming a second gate electrode over the high-k dielectric.

12. The method of claim 1, wherein the plurality of first semiconductor channels and the plurality of second semiconductor channels both comprise an intrinsic semiconductor.

13. The method of claim 1, wherein the first gate structure is formed prior to the second gate structure.

14. A method, comprising:
forming a stack over a substrate, wherein the stack comprises a plurality of first semiconductor layers and a plurality of second semiconductor layers alternately stacked on top of one another;
patterning the stack to remove its end portions, wherein the patterned stack comprises a plurality of first semiconductor channels and a plurality of second semiconductor channels alternately stacked on top of one another;
forming a first dielectric structure and a second dielectric structures extending along opposite sidewalls of the patterned stack;
forming a cavity extending through the patterned stack, wherein the cavity is laterally disposed opposite a first portion of the patterned stack from the first dielectric structure, and opposite a second portion of the patterned stack from the second dielectric structure;
removing, through the cavity, the second semiconductor channels of the first portion and the second semiconductor channels of the second portion;
forming a first gate structure around at least a top surface, a bottom surface, and a first sidewall of each of the plurality of first semiconductor layers of the first portion; and
forming a second gate structure around at least a top surface, a bottom surface, and a first sidewall of each of the plurality of first semiconductor layers of the second portion.

15. The method of claim 14, wherein forming the first gate structure comprises:
forming a gate dielectric over the plurality of first semiconductor channels and the second semiconductor channels;
forming a gate electrode over the gate dielectric, the gate electrode comprising:
   a plurality of horizontal portions vertically bounding the plurality of first semiconductor channels and the second semiconductor channels; and
   a vertical portion connecting the plurality of horizontal portions; and
horizontally etching at least the horizontal portions of the gate electrode by:
   forming openings to access opposite sidewalls of the horizontal portions of the gate electrode; and
   horizontally etching the opposite sidewalls to define a plurality of source regions disposed on an opposite side of the plurality of first and second semiconductor channels from a plurality of drain regions.

16. The method of claim 15, wherein:
the gate dielectric is a high-k dielectric; and
the plurality of first semiconductor channels each comprise an intrinsic semiconductor material.

17. The method of claim 14, wherein the first gate structure and the second gate structure are electrically connected along a vertical boundary thereof.

18. A structure, comprising:
a first dielectric structure vertically extending from a substrate;
one or more first semiconductor channels extending away from the first dielectric structure along a first lateral direction, with a first sidewall of each of the one or more first semiconductor channels in contact with the first dielectric structure;
a second dielectric structure vertically extending from the substrate;
one or more second semiconductor channels extending away from the second dielectric structure along a second, opposite lateral direction, with a first sidewall of each of the one or more second semiconductor channels in contact with the second dielectric structure;
a first gate structure disposed around a top surface, a bottom surface, and a second sidewall of each of the one or more first semiconductor channels;
a second gate structure disposed around a top surface, a bottom surface, and a second sidewall of each of the one or more second semiconductor channels;
a pair of first source/drain structures disposed on opposite sides of the first gate structure along a third lateral direction perpendicular to the first and second lateral direction; and
a pair of second source/drain structures disposed on opposite sides of the second gate structure along the third lateral direction.

19. The structure of claim 18, wherein:
the first gate structure comprises a first high-k dielectric and a first metal electrode; and
the second gate structure comprises a second high-k dielectric, different from the first high-k dielectric, and a second metal electrode, different from the first metal electrode; and the first gate structure is electrically isolated from the second gate structure along a vertical plane disposed therebetween, by a dielectric spacer.

20. The structure of claim 18, wherein the first gate structure and the second gate structure are electrically connected along a vertical boundary thereof.

* * * * *